US012809250B2

(12) United States Patent
Mimotogi

(10) Patent No.: US 12,809,250 B2
(45) Date of Patent: Nov. 24, 2026

(54) INSPECTION DEVICE, INSPECTION METHOD, AND MEDIUM

(71) Applicant: Kioxia Corporation, Tokyo (JP)

(72) Inventor: Shoji Mimotogi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 141 days.

(21) Appl. No.: 18/981,010

(22) Filed: Dec. 13, 2024

(65) Prior Publication Data

US 2025/0291243 A1 Sep. 18, 2025

(30) Foreign Application Priority Data

Mar. 15, 2024 (JP) ................................ 2024-041534

(51) Int. Cl.

*G03F 1/84* (2012.01)
*G01N 21/956* (2006.01)
*G06T 7/00* (2017.01)

(52) U.S. Cl.

CPC ............. *G03F 1/84* (2013.01); *G01N 21/956* (2013.01); *G06T 7/0006* (2013.01); *G01N 2021/95676* (2013.01)

(58) Field of Classification Search

CPC .................... G03F 1/84; G01N 21/956; G01N 2021/95676; G06T 7/0006; G06T 7/001; G06T 2207/10061; G06T 2207/30148
See application file for complete search history.

(56) References Cited

U.S. PATENT DOCUMENTS 8,103,085 B1 * 1/2012 Zadeh ..................... G06T 7/001 382/141
2003/0228048 A1 12/2003 Okada et al.
(Continued)

FOREIGN PATENT DOCUMENTS

JP 2004-13095 A 1/2004
JP 2007-256225 A 10/2007
(Continued)

OTHER PUBLICATIONS

Choi, Jihee, Sheng Yan, and Hong Jeong. "An automated method based on second order moment for defect extraction in photomask images." Advanced Communication Technology, 2009. ICACT 2009. 11th International Conference. vol. 2. 2009. (Year: 2009).*
(Continued)

*Primary Examiner* — Utpal D Shah
(74) *Attorney, Agent, or Firm* — Kim & Stewart LLP

(57) ABSTRACT

An inspection device for a photomask for manufacturing a semiconductor substrate, includes a processor configured to: acquire design data representing a shape of a designed mask pattern to be formed on a photomask, acquire image data representing a shape of a mask pattern formed on the photomask manufactured, determine a first secondary moment of the shape of the designed mask pattern or a first value that varies depending on the first secondary moment, determine a second secondary moment of the shape of the formed mask pattern or a second value that varies depending on the second secondary moment, calculate a first difference between the first and second secondary moments or between the first and second values, compare the first difference with a threshold, and determine whether the manufactured photomask is defective based on a result of the comparison, and generate result data indicating whether the manufactured photomask is defective.

20 Claims, 14 Drawing Sheets

(56) References Cited

U.S. PATENT DOCUMENTS

| | | | | |
|---|---|---|---|---|
| 2004/0257568 | A1* | 12/2004 | Yamane | G06T 7/60 356/625 |
| 2005/0079426 | A1* | 4/2005 | Eguchi | G03F 1/20 430/394 |
| 2006/0161380 | A1* | 7/2006 | Bottemiller | A22C 7/0023 702/151 |
| 2008/0037830 | A1 | 2/2008 | Sugiyama et al. | |
| 2008/0166038 | A1 | 7/2008 | Schwarzband et al. | |
| 2009/0305148 | A1* | 12/2009 | Asano | G03F 1/68 430/30 |
| 2015/0286130 | A1* | 10/2015 | Utzney | G01B 11/02 356/636 |
| 2018/0180991 | A1* | 6/2018 | Nishimura | G03F 1/62 |
| 2021/0109440 | A1* | 4/2021 | Yang | G03F 1/68 |

FOREIGN PATENT DOCUMENTS

| | | | |
|---|---|---|---|
| JP | 2007263899 | A * | 10/2007 |
| JP | 2008-181124 | A | 8/2008 |
| JP | 2011197120 | A * | 10/2011 |

OTHER PUBLICATIONS

Takao Inoue et al., "Evaluation of Image Symmetry Using 3rd Order Moments", Bulletin of Aichi Institute of Technology (No. 32), 1997, pp. 177-182 (with machine translation).

Masanobu Ohtsuki et al., "An Efficient Algorithm for Calculating the Error of Two Figures", Research Reports, National Institute of Technology, Fukushima College (No. 59), 2018, pp. 7-12 (with machine translation).

* cited by examiner

INSPECTION DEVICE, INSPECTION METHOD, AND MEDIUM

CROSS-REFERENCE TO RELATED APPLICATIONS

This application is based upon and claims the benefit of priority from Japanese Patent Application No. 2024-041534, filed Mar. 15, 2024, the entire contents of which are incorporated herein by reference.

FIELD

Embodiments described herein relate generally to an inspection device, an inspection method, and a medium.

BACKGROUND

Inverse Lithography Technology (ILT) is being explored to reduce pattern sizes of semiconductor devices. However, designing a lithographic photomask for a semiconductor device using the ILT generally leads to a complicated shape of a pattern on the photomask. As a result, at a manufacturing phase of such a photomask, it is difficult to determine whether the shape of the pattern conforms to the original design and is proper.

DETAILED DESCRIPTION

Figure 1:
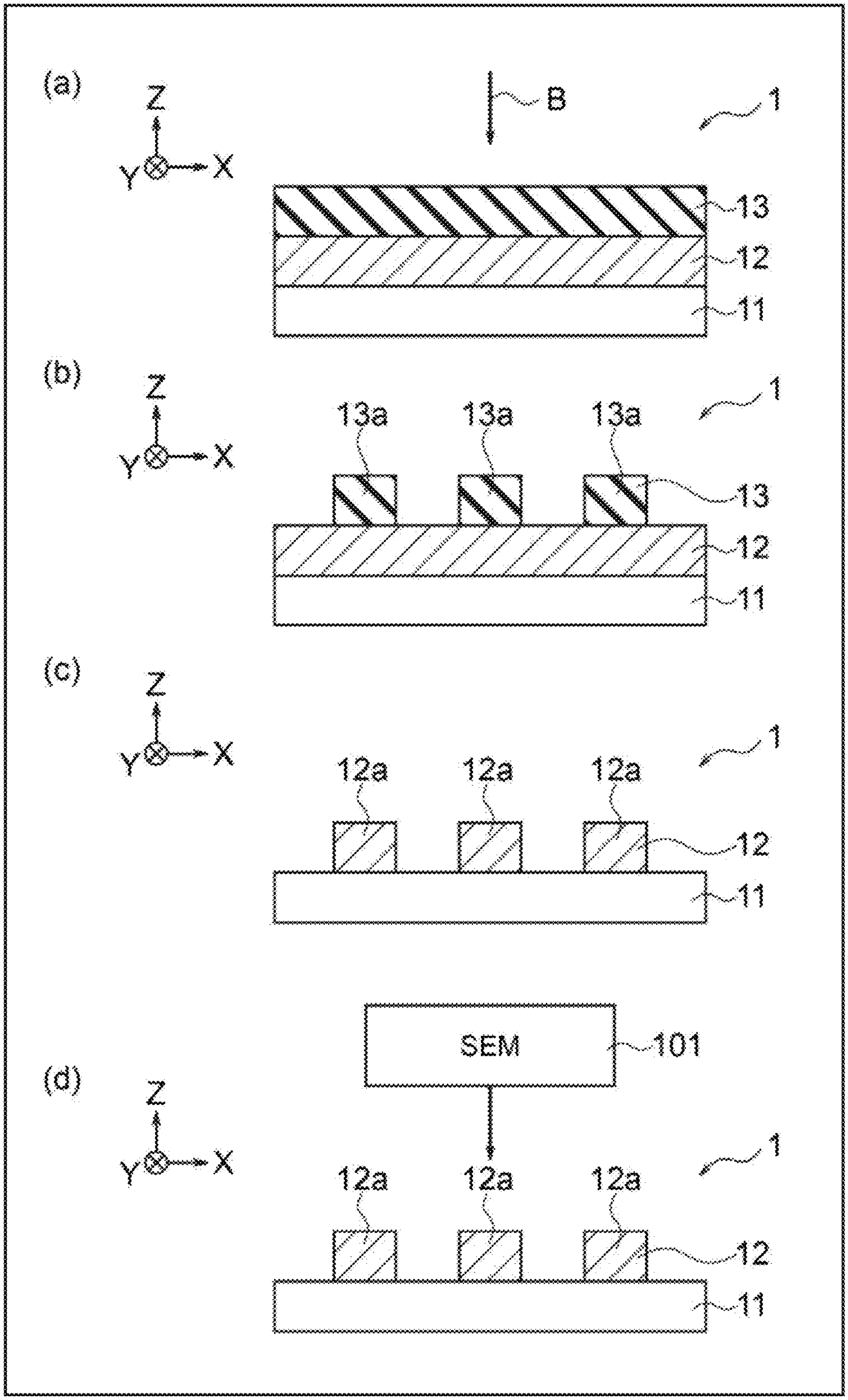
FIG. 1 shows sectional views illustrating a manufacturing method of a photomask according to a first embodiment.

Embodiments of this disclosure provide an inspection device, an inspection method, and a medium, which are capable of determining whether the shape of a complicated pattern on a photomask is proper.

In general, according to one embodiment, an inspection device for a photomask for manufacturing a semiconductor substrate comprises: a memory; and a processor configured to: acquire design data representing a shape of a designed mask pattern to be formed on a photomask, acquire image data representing a shape of a mask pattern formed on the photomask that was manufactured, based on the design data, determine a first secondary moment of the shape of the designed mask pattern or a first value that varies depending on the first secondary moment, the first secondary moment representing spread of the shape of the designed mask pattern in a first direction and a second direction perpendicular to the first direction, based on the image data, determine a second secondary moment of the shape of the formed mask pattern or a second value that varies depending on the second secondary moment, the second secondary moment representing spread of the shape of the formed mask pattern in the first and second directions, calculate a first difference between the first and second secondary moments or between the first and second values, compare the first difference with a threshold, and determine whether the manufactured photomask is defective based on a result of the comparison, and generate and store, in the memory, result data indicating whether the manufactured photomask is defective.

Embodiments of the present disclosure will now be described with reference to drawings. In FIG. 1 to FIG. 14, similar configurations have like reference numerals, and duplicated description may not be repeated.

First Embodiment

FIG. 1 shows sectional views illustrating a manufacturing method of a photomask (or a reticle) 1 according to a first embodiment.

First, a substrate (or a mask blank) 11 for the photomask 1 is prepared, a light-shielding layer 12 is formed on the substrate 11, and a resist layer 13 is formed on the light-shielding layer 12 (see view (a) of FIG. 1). Next, the resist layer 13 is irradiated with an electron beam B for pattern drawing.

The substrate 11 is, for example, a transparent substrate such as a quartz substrate or a glass substrate. The substrate 11 functions to transmit light incident on the photomask 1. The light-shielding layer 12 is, for example, an opaque layer such as a chromium (Cr) layer. The light-shielding layer 12 functions to shield light incident on the photomask 1. The resist layer 13 may be of a positive or negative type.

The view (a) of FIG. 1 indicates X-direction, Y-direction, and Z-direction, which intersect with each other. In the view (a) of FIG. 1, X-direction and Y-direction are parallel to a surface of the substrate 11 and perpendicular to each other, and Z-direction is perpendicular to the surface of the substrate 11. In the specification, +Z-direction is also referred to as the upward direction, and −Z-direction is also referred to as the downward direction. −Z-direction may be coincide with the direction of gravity, or may not be coincide with the direction of gravity.

Next, the resist layer 13 is developed (see view (b) of FIG. 1). As a result, a plurality of resist patterns 13*a* is formed from the resist layer 13. Each resist pattern 13*a* has, for example, a circular shape in plan view, and as described later, is used to form a mask pattern for a memory hole of a three-dimensional semiconductor memory.

Next, the light-shielding layer 12 is processed by Reactive Ion Etching (RIE) using the resist layer 13 (see view (c) of FIG. 1). As a result, the resist patterns 13*a* are transferred to the light-shielding layer 12, so that a plurality of shielding patterns 12*a* is formed from the light-shielding layer 12. Each shielding pattern 12*a* has, for example, a circular shape in plan view and is used as a mask pattern for forming a memory hole of a three-dimensional semiconductor memory. Hereinafter, the shielding pattern 12*a* will also be denoted as "mask pattern 12*a*". Note that the resist layer 13 will be removed after processing of the light-shielding layer 12.

The photomask 1 is produced as described above. Thereafter, the mask pattern 12*a* on the photomask 1 is imaged by an SEM 101 to acquire image data of the SEM image of the photomask 1 (see view (d) of FIG. 1). Usage of the image data will be described later.

Figure 2:
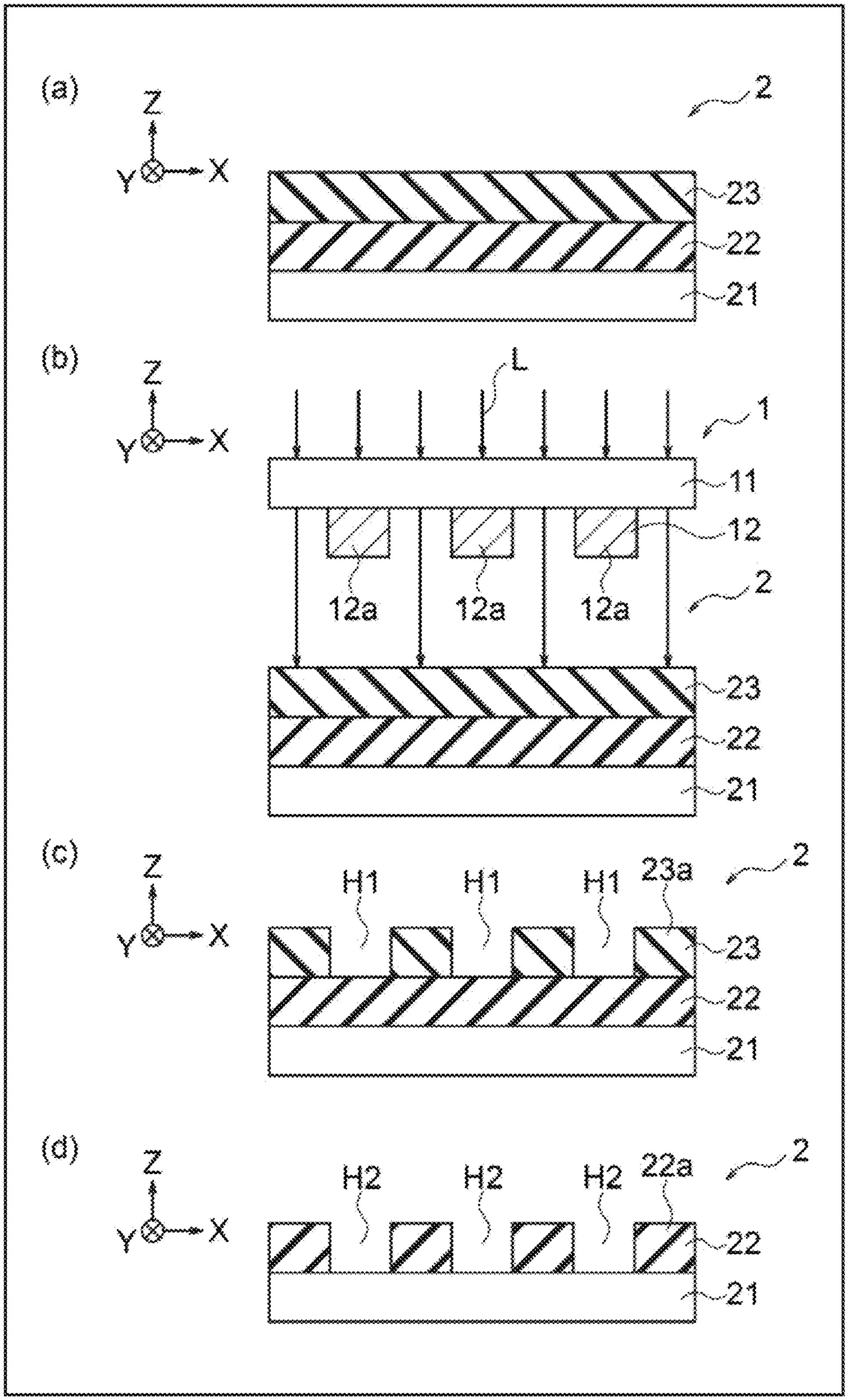
FIG. 2 shows sectional views illustrating a manufacturing method of a semiconductor device according to the first embodiment.

FIG. 2 shows sectional views illustrating a manufacturing method of a semiconductor device 2 according to the first embodiment. The semiconductor device 2 is, for example, a three-dimensional semiconductor memory.

First, a substrate (or a wafer) 21 for a semiconductor device 2 is prepared, a pre-processing layer 22 is formed on the substrate 21, and a resist layer 23 is formed on the pre-processing layer 22 (see view (a) of FIG. 2). The substrate 21 is, for example, a semiconductor substrate such as a silicon (Si) substrate. The pre-processing layer 22 is, for example, a laminate film that alternatingly includes a plurality of sacrificial layers (for example, silicon nitride film) and a plurality of insulation films (for example, silicon oxide film). The resist layer 23 may be of a positive or negative type. In the view (a) of FIG. 2, X-direction and Y-direction are parallel to a surface of the substrate 21 and perpendicular to each other, and Z-direction is perpendicular to the surface of the substrate 21.

Next, the resist layer 23 is exposed to light (see view (b) of FIG. 2). In the view (b) of FIG. 2, the photomask 1 described above is irradiated with light L and the resist layer 23 is exposed to the light L transmitted through the photomask 1. The light L is, for example, a laser light such as an argon fluoride laser light.

Next, the resist layer 23 is developed (see view (c) of FIG. 2). As a result, a plurality of holes H1 corresponding to the mask patterns 12*a* is formed in the resist layer 23. A remaining portion 23*a* of the resist layer 23 is a portion except for the holes H1 in the resist layer 23. Each hole H1 has, for example, a circular shape in plan view, and as described later, is used to form a memory hole of a three-dimensional semiconductor memory.

Next, the pre-processing layer 22 is processed by RIE using the resist layer 23 (see view (d) of FIG. 2). As a result, the holes H1 are transferred to the pre-processing layer 22, so that a plurality of holes H2 is formed in the pre-processing layer 22. A remaining portion 22*a* of the pre-processing layer 22 is a portion except for holes H2 in the pre-processing layer 22. Each hole H2 has, for example, a circular shape in plan view and is used as a memory hole of a three-dimensional semiconductor memory. Hereinafter, the hole H2 will also be denoted as "memory hole H2". Note that the resist layer 23 will be removed after processing of the pre-processing layer 22.

The semiconductor device 2 is produced as described above. The semiconductor device 2 may be any other device than the three-dimensional semiconductor memory and may, for example, be a logic circuit device. Furthermore, the photomask 1 may be used to produce any other device than the semiconductor device 2.

Figure 3:
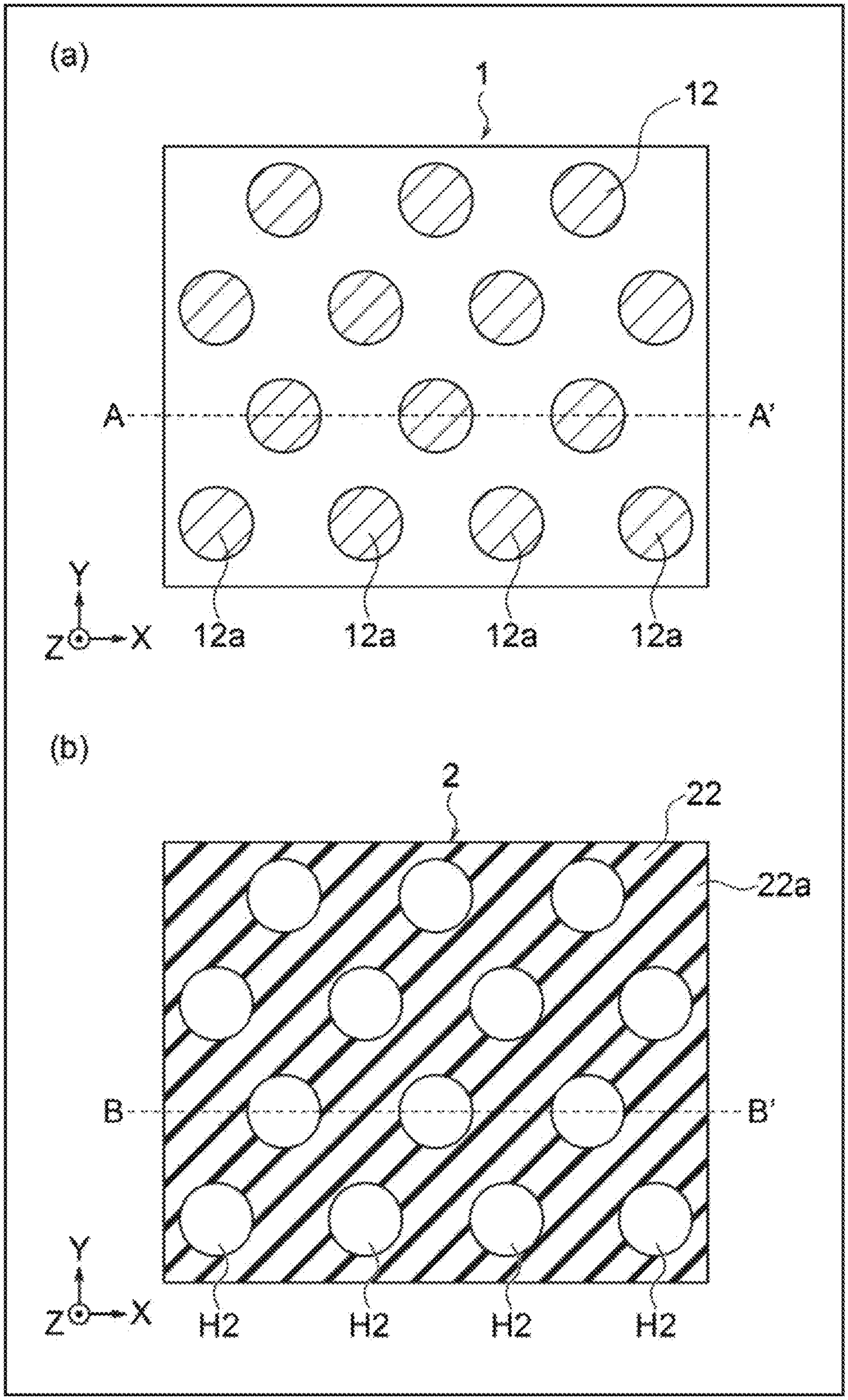
FIG. 3 shows plan views illustrating a structure of the photomask and the semiconductor device according to the first embodiment.

FIG. 3 shows plan views illustrating a structure of the photomask 1 or the semiconductor device 2 according to the first embodiment.

The view (a) of FIG. 3 illustrates a layout of the plurality of mask patterns 12*a* included in the photomask 1. Each mask pattern 12*a* illustrated in the view (a) of FIG. 3 has a circular shape in plan view. The view (c) of FIG. 1 and the view (d) of FIG. 1 illustrate XZ-sections taken along line A-A' indicated in the view (a) of FIG. 3.

The view (b) of FIG. 3 illustrates a layout of the plurality of memory holes H2 included in the semiconductor device 2. Each memory hole H2 illustrated in the view (b) of FIG. 3 has a circular shape in plan view. The view (d) of FIG. 2 illustrates an XZ-section taken along line B-B' indicated in the view (b) of FIG. 3.

Note that the planar shape of the memory hole H2 may not match the planar shape of the mask pattern 12*a*. For example, when the planar shape of the memory hole H2 is circular, the planar shape of the mask pattern 12*a* may be a shape other than circular (for example, square or a shape close to square). Furthermore, the planar shape of the mask pattern 12*a* may be a shape designed in consideration of Optical Proximity Correction (OPC).

Figure 4:
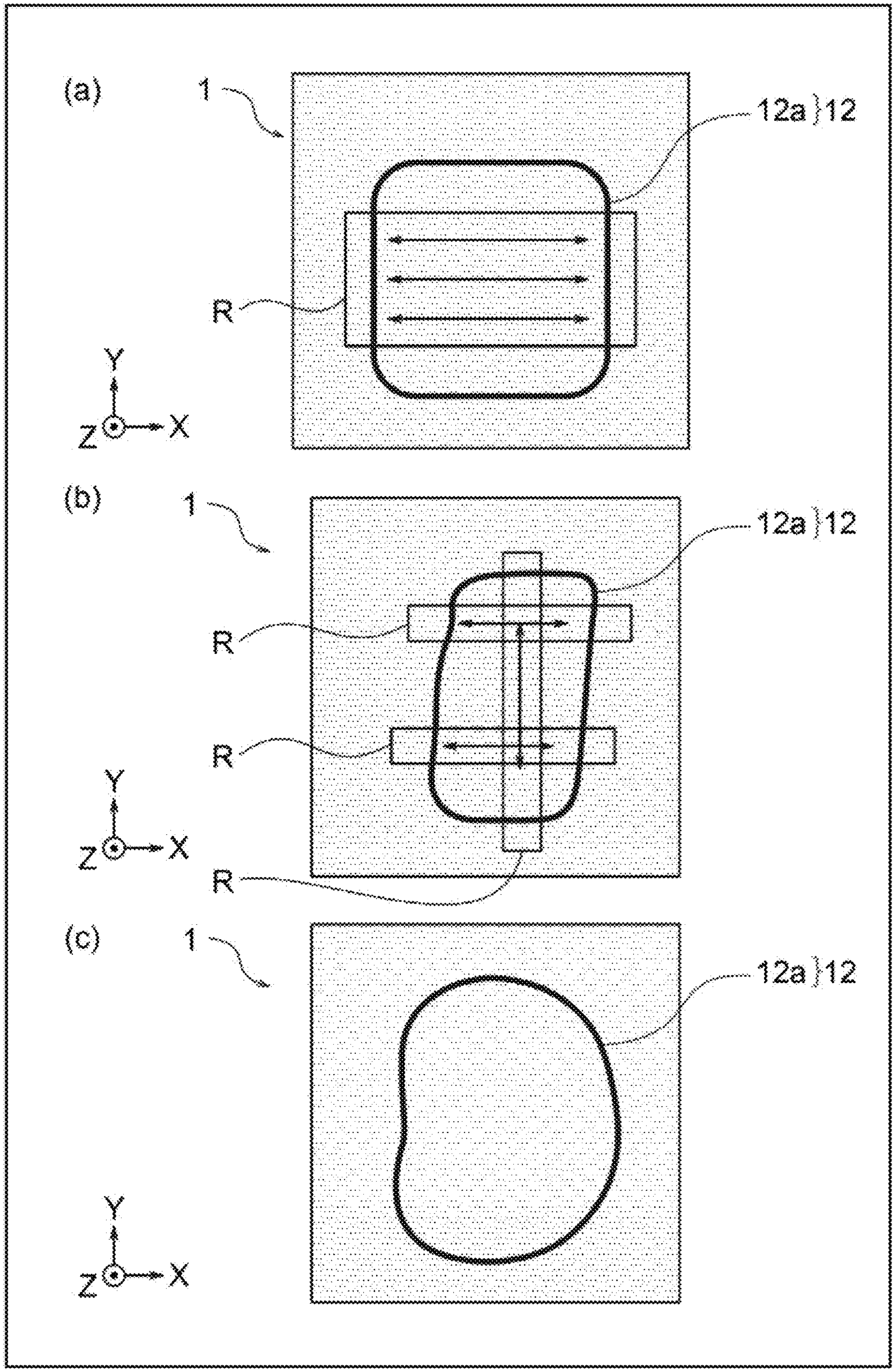
FIG. 4 shows plan views illustrating Scanning Electron Microscope (SEM) images of mask patterns according to a first comparative example, a second comparative example, and the first embodiment.

FIG. 4 shows plan views illustrating SEM images of mask patterns 12*a* according to a first comparative example, a second comparative example, and the first embodiment.

The view (a) of FIG. 4 illustrates an SEM image of the mask pattern 12*a* in the case in which the photomask 1 according to the first comparative example is imaged by the SEM 101. A bold line indicated in the view (a) of FIG. 4 indicates an edge of the mask pattern 12*a*. A mask pattern 12*a* illustrated in the view (a) of FIG. 4 has a planar shape that is close to square.

The view (a) of FIG. 4 further illustrates a region R referred to as a Region of Interest (ROI: a region to be measured). In the view (a) of FIG. 4, the shape of the ROI is rectangular or oblong, and the ROI overlaps the left edge and the right edge of the mask pattern 12*a*.

The mask assurance (or pattern assurance) of the comparative example is achieved by using the ROI. The mask assurance refers to a determination whether the shape of the mask pattern 12*a* on the photomask 1 satisfies prescribed specifications. For example, when it is determined that the shape of the mask pattern 12*a* under measurement satisfies prescribed specifications, it is determined that the photomask 1 is acceptable (i.e., non-defective) and the photomask 1 is approved for shipment. On the other hand, when it is determined that the shape of the mask pattern 12*a* under measurement does not satisfy prescribed specifications, it is determined that the photomask 1 is defective and the photomask 1 is isolated from those approved for shipment.

In the mask assurance of the comparative example, an ROI is set on an SEM image, positions of the left edge and the right edge of the mask pattern 12*a* in the ROI are extracted, and the distance between the left edge and the right edge is measured as a dimension of the mask pattern 12*a*. At this time, the distance between the left edge and the right edge is measured in a plurality of locations in the ROI, an average value of the distances in those locations is calculated, and a determination is made as to whether the average value satisfies prescribed specifications. It is possible by using an average value for the mask assurance to reduce a noise in a distance measurement. Since the larger the ROI, the more the noise can be reduced, it is preferable to set the ROI as large as possible.

Along with reduction in pattern sizes of semiconductor devices, the size of the mask pattern 12*a* is also reduced. The size or dimension of the mask pattern 12*a* may be smaller than 1 μm, and may even be several tens of nanometers, for example. For assurance of such a mask pattern 12*a*, an electron microscope is more preferable than an optical microscope to use. Accordingly, the mask assurance of the comparative example is carried out by using a SEM image, which is imaged by the SEM 101.

The view (b) of FIG. 4 illustrates an SEM image of the mask pattern 12*a* in the case in which the photomask 1 of the second comparative example is imaged by the SEM 101. A mask pattern 12*a* illustrated in the view (b) of FIG. 4 has a planar shape close to a parallelogram. This indicates that the size of the mask pattern 12*a* is reduced from the first comparative example to the second comparative example, and the shape of the mask pattern 12*a* is complicated.

The view (b) of FIG. 4 further illustrates three regions R each corresponding to the ROI. Generally, the ROI can only be set between two edges that are linear and parallel. Accordingly, compared to the first comparative example, it is difficult to set the ROI in this comparative example. As a result, while the ROI of the first comparative example is set as a simple shape by one region R, the ROIs of this comparative example are set complicated by three regions R.

The view (c) of FIG. 4 illustrates an SEM image of the mask pattern 12*a* in the case in which the photomask 1 according to the first embodiment is imaged by the SEM 101. The photomask 1 includes a mask pattern 12*a* designed by the ILT. In the ILT, the shape of the mask pattern 12*a* for processing a pattern of the hole H1 of the resist layer 23 into a desired shape is calculated by solving an inverse problem. The ILT has an advantage of being suitable for reduction in the size of the mask pattern 12*a*. However, designing the photomask 1 using the ILT generally leads to a complicated shape of the mask pattern 12*a*.

The mask pattern 12*a* illustrated in the view (c) of FIG. 4 has a complicated shape without a portion including two edges that are linear and parallel. Accordingly, it is nearly impossible to set an ROI. Therefore, the mask assurance will be carried out by using an approach other than the ROI, as described later. While being suitable for the photomask 1 designed by the ILT, the approach of the mask assurance can be applied to any other photomasks 1.

Next, an assurance or inspection method for assuring the shape of the mask pattern 12*a* on the photomask 1 according to the first embodiment will be described in detail. In this description, reference will be made to FIG. 5 to FIG. 8 as appropriate. The assurance method is carried out by, for example, an assurance device 201 illustrated in FIG. 8. The details of the assurance or inspection device 201 will be described later.

The assurance method is carried out using design data and image data of the photomask 1. The design data is prepared before the photomask 1 is produced and is used when the photomask 1 is produced in the processes illustrated in the views (a) to (c) of FIG. 1. On the other hand, the image data is acquired by imaging the photomask 1 by the SEM 101 in the process illustrated in view (d) of FIG. 1. In this way, the image data of the SEM image is acquired.

Figure 5:
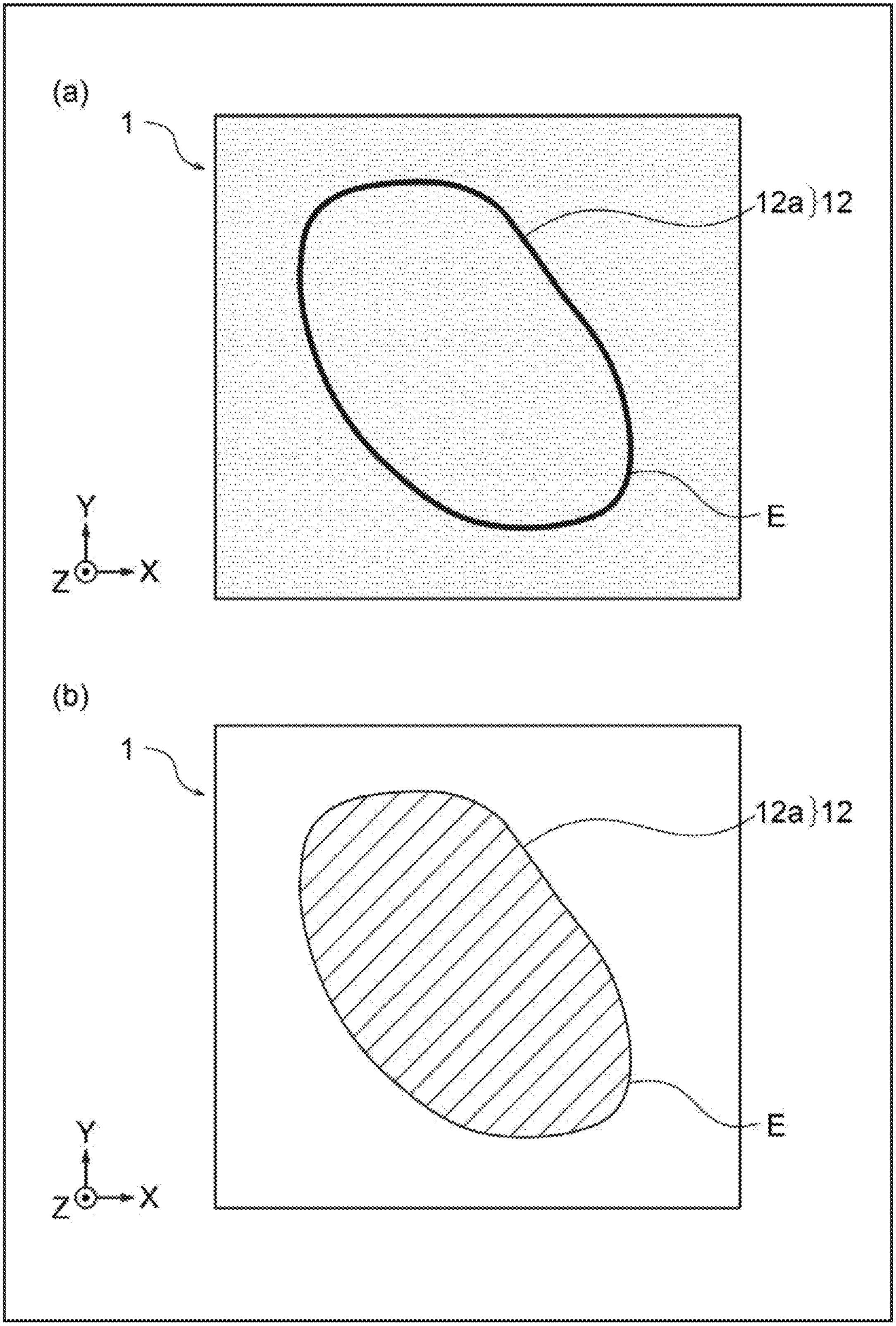
FIG. 5 shows plan views illustrating a SEM image of a mask pattern according to the first embodiment and a shape of the mask pattern extracted from the SEM image.

FIG. 5 shows plan views illustrating an SEM image of a mask pattern 12*a* of the first embodiment and a shape of the mask pattern 12*a* extracted from the SEM image.

As in the view (c) of FIG. 4, the view (a) of FIG. 5 illustrates an SEM image obtained by imaging the photomask 1 by the SEM 101. Since the photomask 1 is designed by the ILT, the mask pattern 12*a* included in the SEM image has a complicated shape. The reference sign E indicated in the view (a) of FIG. 5 indicates an outline or edge of the mask pattern 12*a*.

The image data of the SEM image includes image data of the mask pattern 12*a* and image data of a portion of the photomask 1 near the mask pattern 12*a*. In the first embodiment, the outline E of the mask pattern 12*a* is extracted or determined from the image data of the SEM image. In this way, the shape of the mask pattern 12*a* can be extracted from the SEM image. The view (b) of FIG. 5 illustrates the shape of the mask pattern 12*a* extracted from the SEM image.

Similarly, the outline E of the mask pattern 12*a* is extracted from the design data of the photomask 1. For example, the outline E of the mask pattern 12*a* is extracted from the design data relating to the shape of the mask pattern 12*a* and the shape of a portion of the photomask 1 near the mask pattern 12*a*. In this way, the shape of the mask pattern 12*a* can be extracted from the design data relating to the shape of the photomask 1.

In the assurance method according to the first embodiment, a secondary moment of the mask pattern 12*a* included in the design data of the photomask 1 and a secondary moment of the mask pattern 12*a* included in the image data of the photomask 1 are calculated. At this time, the former secondary moment (hereinafter also referred to as "secondary moment in design data") is calculated using the outline E extracted from the design data, and the latter secondary moment (hereinafter also referred to as "secondary moment in image data") is calculated using the outline E extracted from the image data.

Then, the assurance method according to the first embodiment achieves the mask assurance by comparing the secondary moment in design data with the secondary moment in the image data. According to the first embodiment, it is possible by using the secondary moment in place of an ROI to assure the shape of the mask pattern 12*a* on the photomask 1. For example, even when the shape of the mask pattern 12*a* is complicated, it is possible to properly assure the shape of the mask pattern 12*a*.

A calculating method for the secondary moment in the image data will now be specifically described. Note that the secondary moment in the design data is also calculated in a way as described below.

Figure 6:
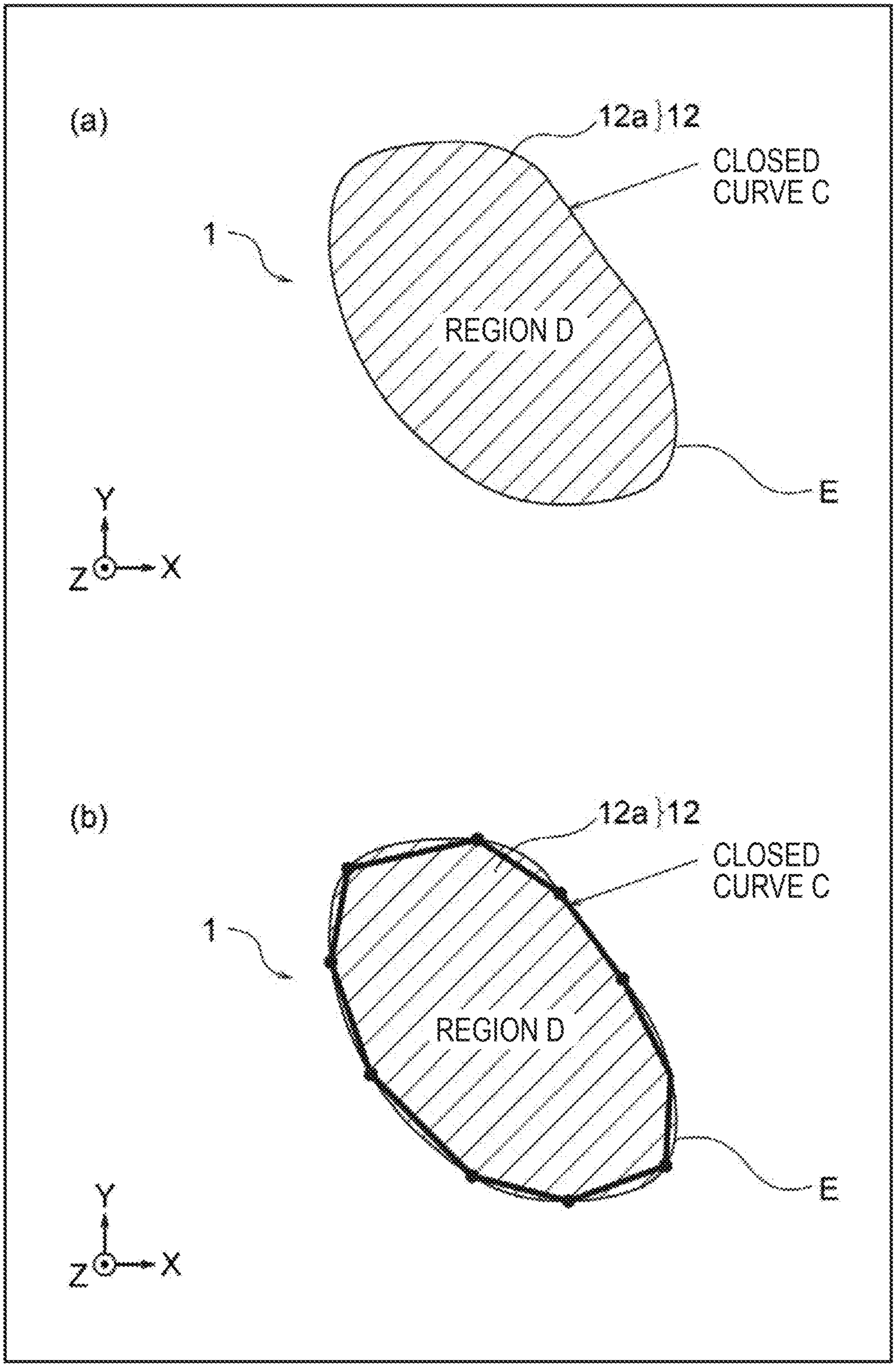
FIG. 6 shows plan views for describing the shape of the mask pattern according to the first embodiment.

FIG. 6 shows plan views for describing the shape of the mask pattern 12*a* according to the first embodiment. As in the view (b) of FIG. 5, the view (a) of FIG. 6 illustrates a shape of the mask pattern 12*a* extracted from the SEM image. The view (a) of FIG. 6 further illustrates a region D occupied by the mask pattern 12*a* and a closed curve C surrounding the region D. The closed curve C corresponds to the outline E described above. Furthermore, the shape of the region D corresponds to the shape of the mask pattern 12*a* in plan view (hereinafter also referred to as "mask shape"). Note that the view (b) of FIG. 6 will be described later.

The mask function m ($k_x$, $k_y$) of the mask pattern 12*a* is expressed by Expression (1).

$$m(k_x, k_y) = \frac{1}{2\pi}\int\int_D dxdy \cdot e^{-i(k_x x + k_y y)} \qquad \text{Expression (1)}$$

In the double integral (i.e., Fourier transform) of the Expression (1), x represents an X-coordinate illustrated in the view (a) of FIG. 6, y represents a Y-coordinate illustrated in the view (a) of FIG. 6, and D represents the region D illustrated in the view (a) of FIG. 6. Furthermore, $k_x$ and $k_y$ represent wave numbers, i represents an imaginary unit, and e represents a Napier's constant. The mask function m ($k_x$, $k_y$) corresponds to a distribution function of diffracted light obtained by causing the mask pattern 12*a* to be irradiated with light. Accordingly, the mask function m ($k_x$, $k_y$) represents the shape of an image formed on the resist layer 23 during exposure illustrated in the view (b) of FIG. 2.

When the exponential function of Expression (1) is subjected to series expansion, specifying up to the second term of the series, and cross terms of x and y are disregarded, the mask function m ($k_x$, $k_y$) is transformed to Expression (2).

$$m(k_x, k_y) = \frac{S}{2\pi} e^{-i(k_x x_{cg} + k_y y_{cg})} \left\{ 1 - \frac{k_x^2 \sigma_x^2 + k_y^2 \sigma_y^2}{2} + \ldots \right\} \quad \text{Expression (2)}$$

In the expression, S represents the area of the region D, which is given by Expression (3). Furthermore, $x_{cg}$ and $y_{cg}$ represent the X-coordinate and the Y-coordinate of the centroid of the region D, which are given by Expression (4) and Expression (5), respectively. Furthermore, $\sigma_x$ and $\sigma_y$ represent secondary moments in the X-direction and the Y-direction around the centroid of the region D, which are given by Expression (6) and Expression (7), respectively.

$$S = \int\int_D dxdy \quad \text{Expression (3)}$$

$$x_{cg} = \frac{1}{S} \int\int_D xdxdy \quad \text{Expression (4)}$$

$$y_{cg} = \frac{1}{S} \int\int_D ydxdy \quad \text{Expression (5)}$$

$$\sigma_x^2 = \frac{1}{S} \int\int_D (x - x_{cg})^2 dxdy \quad \text{Expression (6)}$$

$$\sigma_y^2 = \frac{1}{S} \int\int_D (y - y_{cg})^2 dxdy \quad \text{Expression (7)}$$

The above-described "S", "xcg and ycg", and "σx and σy" correspond to a 0-th moment, primary moments, and secondary moments of the region D (i.e., the mask pattern 12*a*), respectively. Note that xcg and ycg are also referred to as the moment of the first power of x and the moment of the first power of y, respectively, and σx and σy are also referred to as the moment of the second power of x and the moment of the second power of y, respectively.

The exponential portion of Expression (2) is also denoted as exp{−i(kxxcg+kyycg)}. The exponential portion gives a phase in the Fourier plane and represents a position in the actual plane. When the phase in the Fourier plane changes, the position in the actual plane changes accordingly. As indicated in Expression (2), the mask function m(kx, ky) varies depending on the exponential portion or S, σx, and σy. In the first embodiment, S, xcg, ycg, σx, and σy are used to carry out the mask assurance.

According to Green's theorem here, the double integral can be replaced with a line integral (i.e., a contour integral) as seen in Expression (8).

$$\int\int_D \left( \frac{\partial Q}{\partial x} - \frac{\partial P}{\partial y} \right) dxdy = \oint_C (Pdx + Qdy)dy \quad \text{Expression (8)}$$

In the expression, P and Q represent C1 functions. Furthermore, D represents the region D illustrated in the view (a) of FIG. 6, and C represents the closed curve C illustrated in the view (a) of FIG. 6.

According to Green's theorem of Expression (8), Expressions (3) to (7) are transformed to Expressions (9) to (13), respectively.

$$S = \oint_C xdy \quad \text{Expression (9)}$$

$$x_{cg} = \frac{1}{2S} \oint_C x^2 dy \quad \text{Expression (10)}$$

$$y_{cg} = \frac{1}{2S} \oint_C y^2 dy \quad \text{Expression (11)}$$

$$\sigma_x^2 = \frac{1}{3S} \oint_C (x - x_{cg})^3 dy \quad \text{Expression (12)}$$

$$\sigma_y^2 = \frac{1}{3S} \oint_C (y - y_{cg})^3 dx \quad \text{Expression (13)}$$

The outline E of the mask pattern 12*a* is extracted from image data of the mask pattern 12*a*. This makes it possible to identify the shape of the closed curve C, and as a result, it becomes possible to calculate contour integrals of Expressions (9) to (13) by using the identified closed curve C. S, xcg, ycg, σx, and σy, which are calculated by Expressions (9) to (13), are used to carry out the mask assurance.

As illustrated in the view (b) of FIG. 6, the shape of the extracted outline E is approximated using a polygon with three or more apices. In the view (b) of FIG. 6, each apex of the polygon is located on the outline E, and the apices of the polygon are connected together by lines. The shape of the closed curve C is regarded as the polygon to calculate contour integrals of Expressions (9) to (13), so that S, xcg, ycg, σx, and σy can easily be calculated. At this time, it is possible to calculate contour integrals accurately by applying curve interpolation such as linear interpolation or Bezier interpolation between apices of the polygon.

The mask assurance is carried out by using secondary moments "σx" and "σy" calculated from image data. The secondary moments are calculated by using Expression (12) and Expression (13) described above. However, Expression (12) and Expression (13) include an area "S" and centroid coordinates "xcg" and "ycg". Accordingly, in calculating the secondary moments, Expression (9), Expression (10), and Expression (11) are also used to calculate the area and the centroid coordinates.

The mask assurance is carried out using a secondary moment calculated from image data and a secondary moment calculated from design data. A method for calculating a secondary moment from design data is the same as a method for calculating a secondary moment from image data. Accordingly, when a secondary moment is calculated from design data, Expressions (9) to (13) are used. At this time, the shape of the closed curve C is identified by extracting the outline E from design data.

The secondary moment in the design data and the secondary moment in the image data are compared, and the comparison result of the secondary moments is used to carry out the mask assurance. For example, when an absolute value of the difference between a secondary moment σx in design data and a secondary moment σx in image data is smaller than a threshold and an absolute value of the difference between a secondary moment σy in design data and a secondary moment σy in image data is smaller than a threshold, the photomask 1 may be determined as acceptable or no-defective. On the other hand, the absolute value of the difference between the secondary moment σx in the design data and the secondary moment σx in the image data is larger than the threshold or the absolute value of the difference between the secondary moment σy in the design data and the secondary moment σy in the image data is larger than the threshold, the photomask 1 may be determined as defective. In this case, both the comparison between the secondary moments and the determination whether the photomask is acceptable or defective may be performed by a device, or the comparison between the secondary moments is performed by a device and the determination whether it is acceptable or defective may be made by a human.

As described above, the mask assurance is carried out using secondary moments in place of an ROI. In this way, even when a mask pattern 12*a* that is difficult to set an ROI, as in the case of a mask pattern 12*a* designed by the ILT, is treated, it is possible to carry out the mask assurance. Note that the mask assurance may be carried out using a value that varies depending on a secondary moment in place of the secondary moment. An example of such mask assurance will be described later.

Figure 7:
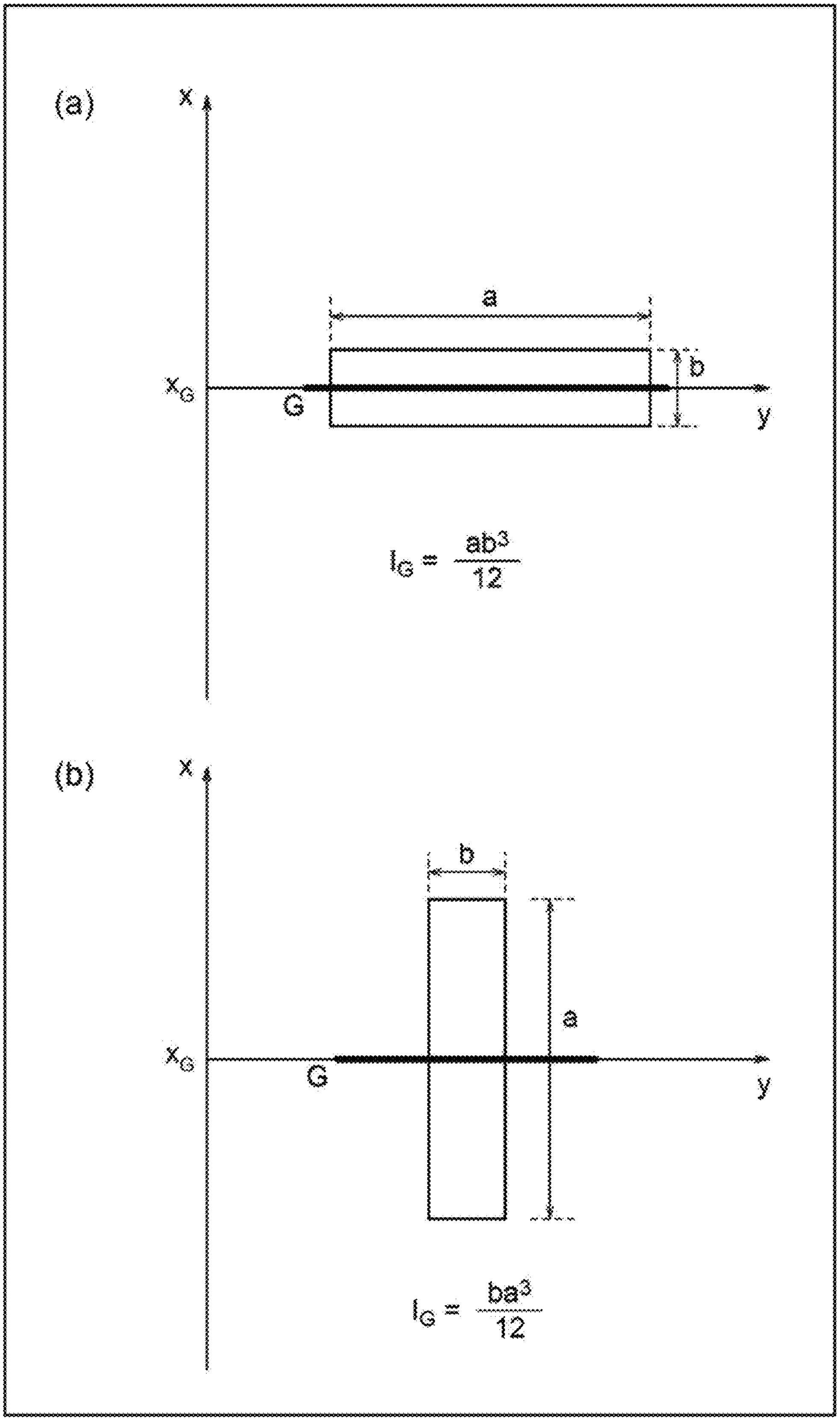
FIG. 7 shows graphs for describing an n-th moment according to the first embodiment.

To facilitate understanding of an n-th moment (n is an integer not less than 0) of the mask pattern 12*a*, an n-th moment of a general function f(x) will now be described. FIG. 7 shows graphs for describing the n-th moment according to the first embodiment.

The n-th moment of the function f(x) is expressed by Expression (14).

$$\int_0^t f(x)x^n dx \qquad \text{Expression (14)}$$

When 0 is substituted for n of Expression (14), a 0-th moment of f(x) is obtained as seen in Expression (15).

$$\int_0^t f(x)x^0 dx = \int_0^t f(x)dx = s \qquad \text{Expression (15)}$$

In Expression (15), the 0-th moment of f(x) is a value "s". The value "s" represents the area of a figure between the x-axis and a curve f(x) in an interval.

When 1 is substituted for n of the Expression (14), a primary moment of f(x) is obtained as seen in Expression (16).

$$\int_0^t f(x)x^1 dx = \int_0^t f(x)x dx = s \cdot x_G \qquad \text{Expression (16)}$$

In Expression (16), the primary moment of f(x) is a product of a value "s" and a value xG. The value xG represents an x-coordinate of the centroid of the figure.

When 2 is substituted for n of Expression (14), a secondary moment of f(x) is given as seen in Expression (17).

$$\int_0^t f(x)x^2 dx = I_G \qquad \text{Expression (17)}$$

In Expression (17), a secondary moment of f(x) is a value IG. The value IG represents the extent of stretch of the figure in the x-direction.

The view (a) of FIG. 7 illustrates a figure of an oblong shape, the length of which in the y-direction is "a" and the length in the x-direction is "b". The view (a) of FIG. 7 further illustrates an axis G passing along the x-coordinate "xG" of the centroid of the figure. In the view (a) of FIG. 7, the secondary moment IG of the figure is calculated as ab3/12 by Expression (17).

The view (b) of FIG. 7 illustrates a figure of an oblong shape, the length of which in the x-direction is "a" and the length in the y-direction is "b". The view (b) of FIG. 7 further illustrates an axis G passing along the x-coordinate "xG" of the centroid of the figure. In the view (b) of FIG. 7, the secondary moment IG of the figure is calculated as ba3/12 by Expression (17).

In the views (a) and (b) of FIG. 7, "a" is longer than "b" (a>b). Accordingly, the secondary moment IG (=ba3/12) of the figure illustrated in the view (b) of FIG. 7 is larger than the secondary moment IG (=ab3/12) of the figure illustrated in the view (a) of FIG. 7. This corresponds to the fact that the stretch of the figure illustrated in the view (a) of FIG. 7 in the x-direction is small and the stretch of the figure illustrated in the view (b) of FIG. 7 in the x-direction is large.

Figure 8:
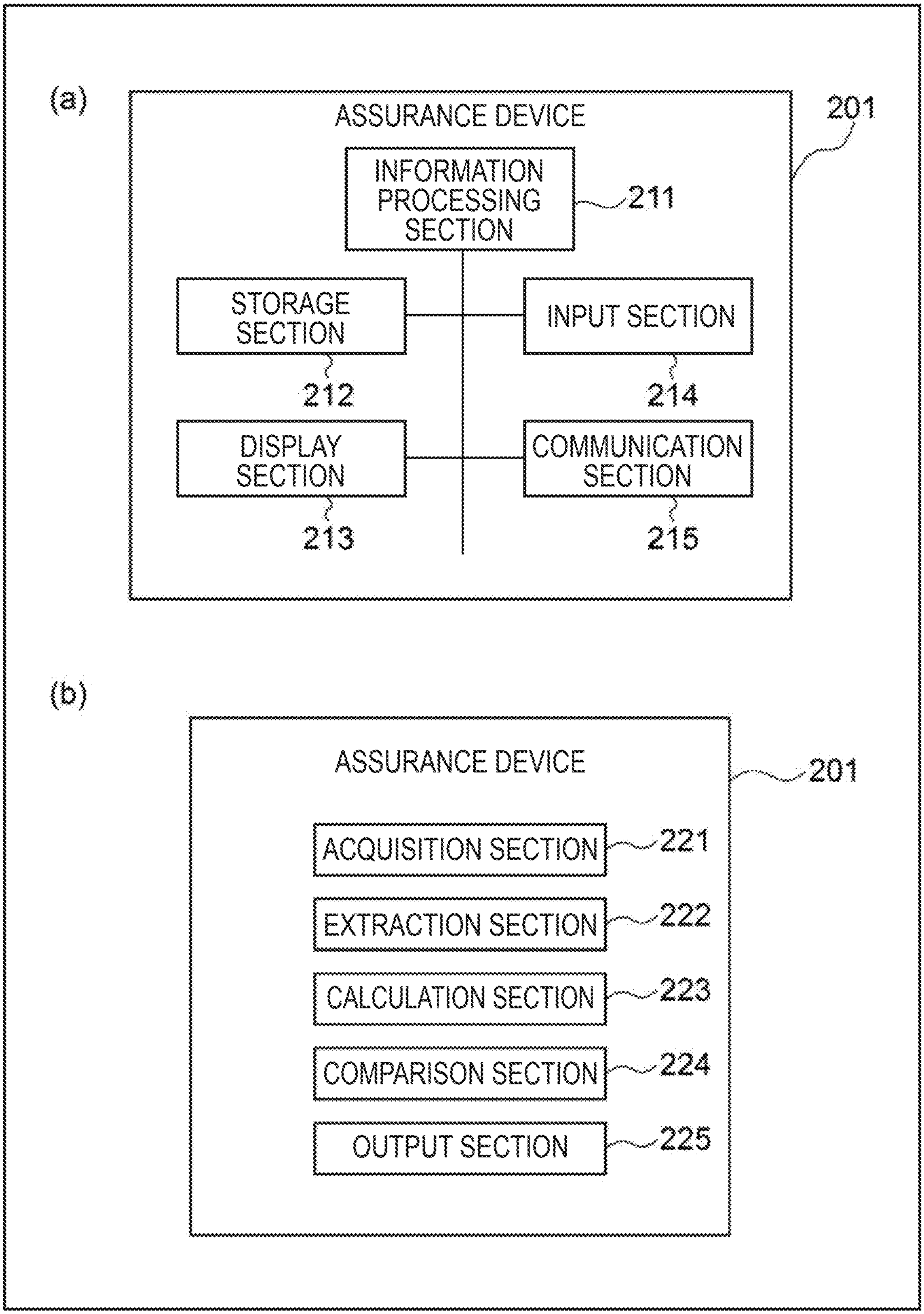
FIG. 8 shows block diagrams illustrating a hardware configuration and a functional configuration of an assurance device according to the first embodiment.

FIG. 8 shows block diagrams illustrating a hardware configuration and a functional configuration of an assurance device 201 (hereinafter also referred to as an inspection device) according to the first embodiment.

The view (a) of FIG. 8 illustrates the hardware configuration of the assurance device 201. As illustrated in the view (a) of FIG. 8, the assurance device 201 includes an information processing section 211, a storage section 212, a display section 213, an input section 214, and a communication section 215.

The information processing section 211 includes, for example, a processor such as a central processing unit (CPU). The storage section 212 includes, for example, a read only memory (ROM), a random access memory (RAM), a hard disk drive (HDD), a memory drive, and a memory interface. The memory drive or the memory interface is used, for example, to insert a storage media such as a semiconductor memory into the assurance device 201.

The display section 213 includes, for example, a liquid crystal display (LCD) or an indicator. The input section 214 includes, for example, a keyboard or a mouse. The communication section 215 includes, for example, a communication or network interface circuit. The communication interface is used, for example, to connect the assurance device 201 to a communication network such as a local area network (LAN) in a wired or wireless manner.

An assurance program for the mask assurance is stored, for example, in the ROM or the HDD of the storage section 212. The functional configuration illustrated in the view (b) of FIG. 8 described later is achieved, for example, by causing the CPU of the information processing section 211 to execute the assurance program.

Note that when the assurance program is to be installed on the assurance device 201, a computer readable storage medium with the assurance program stored thereon may be prepared to install the assurance program onto the assurance device 201. In the meantime, the assurance program may be downloaded via a network to install the assurance program onto the assurance device 201.

The view (b) of FIG. 8 illustrates the functional configuration of the assurance device 201. As illustrated in the view (b) of FIG. 8, the assurance device 201 performs the functions of an acquisition section 221, an extraction section 222, a calculation section 223, a comparison section 224, and an output section 225.

The acquisition section 221 acquires design data and image data of the photomask 1. For example, before the process of the assurance method is started, the user of the assurance device 201 saves the design data and the image data in the HDD of the storage section 212, and when the process of the assurance method is started, the acquisition section 221 acquires or reads the design data and the image data from the HDD of the storage section 212.

Note that at least one of the design data and the image data may be saved automatically in the HDD of the storage section 212. For example, the image data may be sent automatically from the SEM 101 to the assurance device 201 and saved in the HDD of the storage section 212. Furthermore, the acquisition section 221 may acquire at least one of the design data and the image data from a device external to the assurance device 201 via the communication section 215 when the process of the assurance method of the embodiment is started. For example, the design data may be acquired from a server device in which the design data is saved. Furthermore, the image data may be acquired from the SEM 101 that has acquired the image data by imaging.

The extraction section 222 extracts or determines the outline E of the mask pattern 12*a* from the design data and extracts the outline E of the mask pattern 12*a* from the image data. The outlines E extracted from the design data and the image data are used to identify the closed curve C for calculating contour integrals described above.

The calculation section 223 calculates the area S, the centroid coordinates xcg and ycg, and the secondary moments σx and σy of the mask pattern 12*a* included in the design data based on the design data. The calculation is carried out by using the outline E extracted from the design data to calculate the contour integrals in Expressions (9) to (13). The calculation section 223 further calculates the area S, the centroid coordinates xcg and ycg, and the secondary moments σx and σy of the mask pattern 12*a* included in the image data based on the image data. The calculation is carried out by using the outline E extracted from the image data to calculate the contour integrals in Expressions (9) to (13). The contour integrals relating to the design data and the image data may be calculated by using a polygon described above, for example.

The comparison section 224 compares the secondary moment in the design data with the secondary moment in the image data. For example, the comparison section 224 compares the secondary moment σx in the design data with the secondary moment σx in the image data, and compares the secondary moment σy in the design data with the secondary moment σy in the image data.

The output section 225 outputs information relating to the design data and/or the image data. For example, the output section 225 may output the above-described information in such a way as to save the comparison result between the secondary moment in the design data and the secondary moment in the image data in a storage device (for example, the HDD of the storage section 212). The output section 225 may also output the above-described information in such a way as to display the shape of the outline E extracted from the design data or the shape of the outline E extracted from the image data on a display device (for example, the display section 213). The storage device or the display device described above may be provided external to the assurance device 201.

The comparison section 224 calculates a difference between the secondary moment σx in the design data and the secondary moment σx in the image data (hereinafter referred to as "first difference") and difference between the secondary moment σy in the design data and the secondary moment σy in the image data (hereinafter referred to as "second difference"). The comparison section 224 outputs calculation results of the first difference and the second difference and saves them in the HDD of the storage section 212. The user can determine whether the photomask 1 is acceptable or defective by checking the calculation results. For example, when the absolute value of the first difference is smaller than a threshold and the absolute value of the second difference is smaller than a threshold, the photomask 1 may be determined as acceptable. On the other hand, when the absolute value of the first difference is larger than the threshold or the absolute value of the second difference is larger than the threshold, the photomask 1 may be determined as defective.

Note that the comparison section 224 may compare the absolute value of the first difference with a threshold and compare the absolute value of the second difference with the threshold, and the output section 225 may save a comparison result between the absolute value of the first difference and the threshold and a comparison result between the absolute value of the second difference and the threshold. Furthermore, the comparison section 224 may determine whether the photomask 1 is acceptable or defective based on these comparison results, and the output section 225 may save the determination result of whether the photomask is acceptable or defective. In these cases, the user can more easily determine whether the photomask 1 is acceptable or defective.

Here, the threshold may be defined by calculating a change attributed to the mask shape in the shape of a pattern on the substrate 21 by lithography simulation such that a change in the shape of a pattern on the substrate 21 falls within a predetermined tolerance, or may be defined such that a value resulting from dividing the absolute value of the difference by the secondary moment in the design data falls within several percent. The threshold may also be as determined according to a traditional mask assurance method.

Furthermore, the acquisition section 221 may acquire secondary moments σx and σy in design data in place of the design data. For example, a device external to the assurance device 201 is caused to calculate the secondary moments σx and σy from the design data, and the secondary moments σx and σy may be saved in the HDD of the storage section 212. In this case, the acquisition section 221 acquires the secondary moments σx and σy in the design data from the HDD of the storage section 212, and the comparison section 224 uses the secondary moments σx and σy for comparison.

Similarly, in place of the image data, the acquisition section 221 may acquire secondary moments σx and σy in image data. For example, a device external to the assurance device 201 may be caused to calculate the secondary moments σx and σy from the image data, and the secondary moments σx and σy may be saved in the HDD of the storage section 212. In this case, the acquisition section 221 acquires the secondary moments σx and σy in the image data from the HDD of the storage section 212, and the comparison section 224 uses the secondary moments σx and σy for comparison.

As described above, according to the first embodiment, the mask assurance is carried out by comparing secondary moment in design data and secondary moment in image data. Accordingly, it is possible to properly assure the shape of the mask pattern 12*a* on the photomask 1. For example, even when the shape of the mask pattern 12*a* is complicated, proper mask assurance can be carried out.

Second Embodiment

Figure 9:
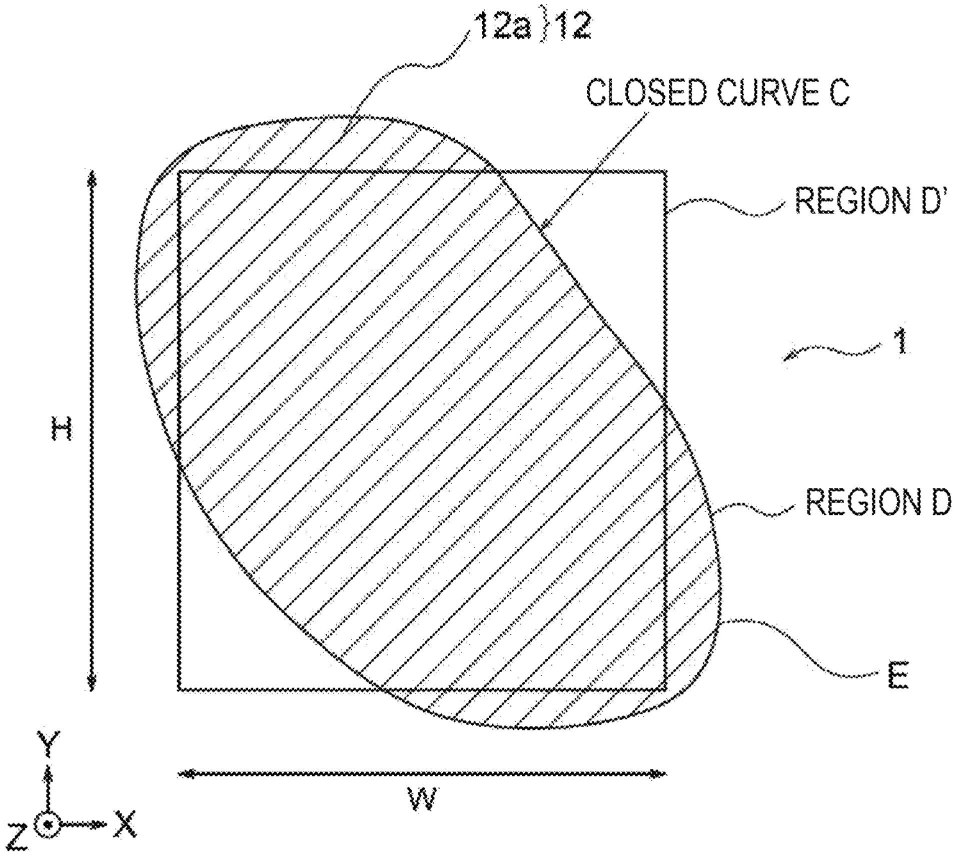
FIG. 9 is a plan view illustrating a shape of a mask pattern according to a second embodiment.

FIG. 9 is a plan view illustrating a shape of a mask pattern 12*a* according to a second embodiment.

FIG. 9 illustrates the shape of the mask pattern 12*a* extracted from the SEM image, as in the view (a) of FIG. 6. FIG. 9 further illustrates a region D occupied by the mask pattern 12*a* and a closed curve C (i.e., an outline E) surrounding the region D, as in the view (a) of FIG. 6.

In the second embodiment, a region D' corresponding to the region D is defined as illustrated in FIG. 9. The region D' is a rectangular region (or an oblong region) that has the same area and centroid coordinates as the area S and the centroid coordinates xcg and ycg of the region D. FIG. 9 illustrates a width W that is a dimension of the region D' in X-direction and a height H that is a dimension of the region D' in Y-direction. The width W and the height H are defined by Expression (18) and Expression (19), respectively.

$$W = \gamma \cdot \sigma_x \qquad \text{Expression (18)}$$

$$H = \gamma \cdot \sigma_y \qquad \text{Expression (19)}$$

In the expression, coefficients γ in Expression (18) and Expression (19) are defined by Expression (20).

$$\gamma = \sqrt{\frac{S}{\sigma_x \sigma_y}} \qquad \text{Expression (20)}$$

Using Expression (18) and Expression (19) to calculate W·H results in a relational expression of W·H=γ2σx·σy. Substituting Expression (20) for the relational expression results in W·H=S. This means that the area W·H of the region D' is equal to the area S of the region D.

In the assurance method according to the second embodiment, a region R' is defined for the mask pattern 12*a* included in design data of the photomask 1, and a width W and a height H of the region R' are calculated. In the assurance method, a region R' is further defined for the mask pattern 12*a* included in image data of the photomask 1, and a width W and a height H of the region R' are calculated. Hereinafter, the region R', the width W, and the height H of the former will be referred to as "the region R', the width W, and the height H in design data", and the region R', the width W, and the height H of the latter will be referred to as "the region R', the width W, and the height H in image data". The region R', the width W, and the height H in design data are defined and calculated by using S, xcg and ycg, and σx and σy in the design data as well as Expressions (18) to (20), and the region R', the width W, and the height H in image data are defined and calculated by using S, xcg and ycg, and σx and σy in the design data as well as Expressions (18) to (20). It is possible to calculate S, xcg and ycg, and σx and σy in the design data and the image data according to the assurance method of the first embodiment.

The assurance method according to the second embodiment then achieves the mask assurance by comparing the width W and the height H in design data with the width W and the height H in image data. It is possible to assure the shape of the mask pattern 12*a* on the photomask 1 by using the width W and the height H in place of an ROI. For example, even when the shape of the mask pattern 12*a* is complicated, it is possible to properly assure the shape of the mask pattern 12*a*. Furthermore, in place of secondary moments σx and σy that are generally less familiar to the users, it is possible to carry out the mask assurance that is comprehensible to the users by using the width W and the height H that are generally familiar to the users. The width W and the height H are examples of values that vary depending on the secondary moments σx and σy.

The assurance method according to the second embodiment can be also carried out, for example, by the assurance device 201 illustrated in FIG. 8. In this case, the calculation section 223 calculates the width W and the height H in design data and the width W and the height H in image data, and the comparison section 224 compares the width W and the height H in design data with the width W and the height H in image data. The comparison section 224 calculates the difference between the width W in design data and the width W in image data as the first difference, in place of the difference between a secondary moment σx in design data and a secondary moment σx in image data, and calculates the difference between the height H in design data and the height H in image data as the second difference, in place of the difference between a secondary moment σy in design data and a secondary moment σy in image data. The usage of the first difference and the second difference of the embodiment is similar to the usage of the first difference and the second difference of the first embodiment.

Furthermore, the acquisition section 221 may acquire the width W and the height H in design data in place of the design data. In this case, the comparison section 224 uses the width W and the height H for comparison. Similarly, the acquisition section 221 may acquire the width W and the height H in image data in place of the image data. In this case, the comparison section 224 uses width W and the height H for comparison.

As described above, according to the second embodiment, the mask assurance is carried out by comparing the width W and the height H in design data with the width W and the height H in image data. Accordingly, as in the first embodiment it is possible to properly assure the shape of the mask pattern 12*a* on the photomask 1.

Third Embodiment

Figure 10:
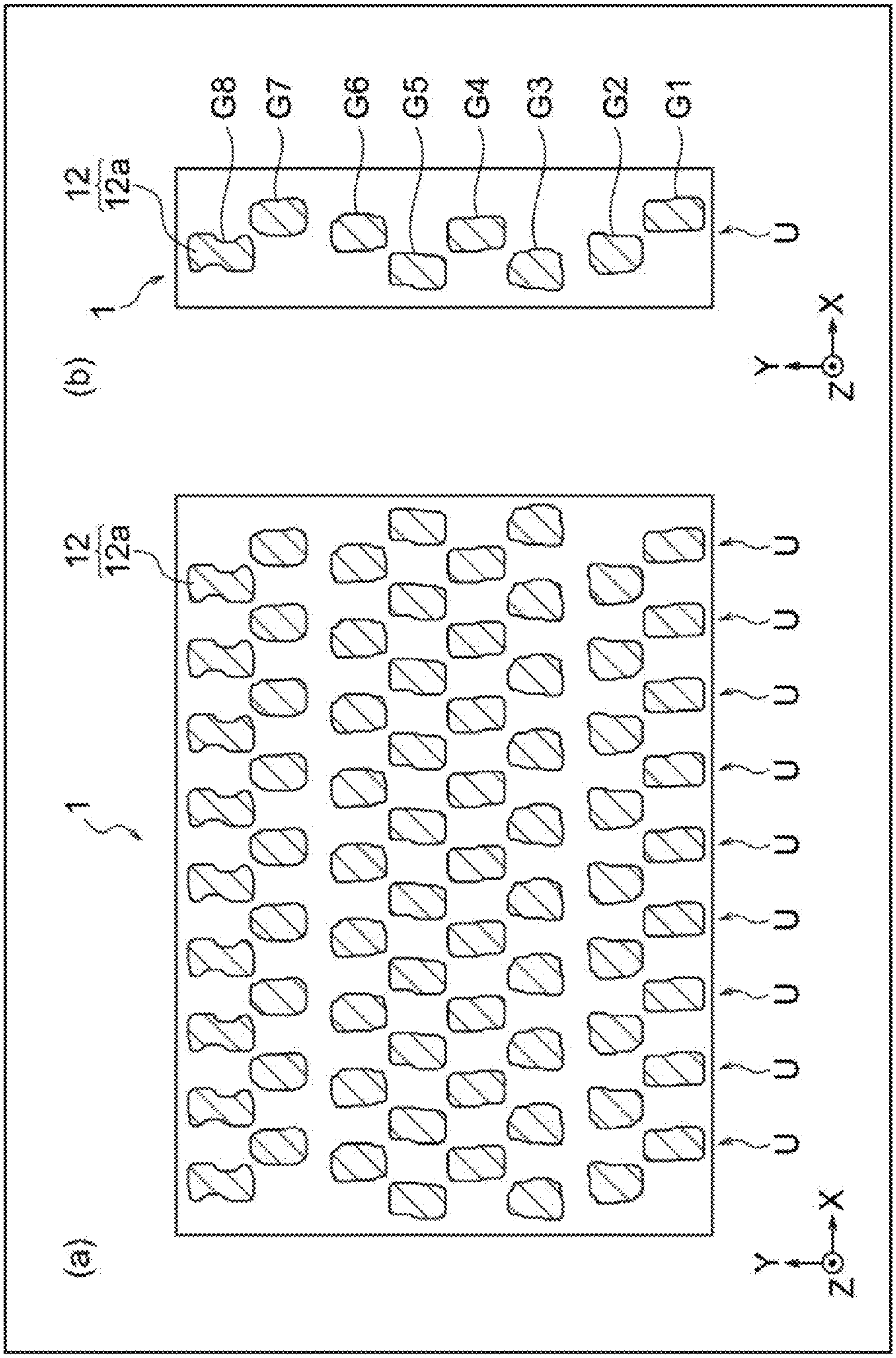
FIG. 10 is a plan view illustrating shapes of mask patterns according to a third embodiment.

FIG. 10 is a plan view illustrating shapes of mask patterns 12*a* according to a third embodiment.

The view (a) of FIG. 10 illustrates the shapes of the mask patterns 12*a* extracted from an SEM image. The view (b) of FIG. 10 illustrates a unit U that includes 8 mask patterns 12*a* arranged substantially along Y-direction. The 8 mask patterns 12*a* in the unit U illustrated in the view (b) of FIG. 10 each have a planar shape different from each other. In the meantime, the view (a) of FIG. 10 illustrates a structure in which a plurality of units U, each of which has substantially the same planar formation, is arranged periodically along X-direction. When the semiconductor device 2 has a periodical structure, it is common that the photomask 1 includes a plurality of mask patterns 12*a* arranged periodically.

In the third embodiment, the mask patterns 12*a* illustrated in view (a) of FIG. 10 are sorted into 8 groups G1 to G8 based on the planar shape of each mask pattern 12*a*. Each of the groups G1 to G8 includes two or more mask patterns 12*a* that are considered as having the same planar shape. The 8 mask patterns 12*a* in each unit U belong to groups G1 to G8 respectively as illustrated in the view (b) of FIG. 10. In the view (a) of FIG. 10, two or more mask patterns 12*a* belonging to the same group are adjacent to each other in X-direction, and have a planar shape that overlaps each other by translation in X-direction. Note that the number of groups may be 1 to 7, or may be 9 or more.

Here, consider the case in which the mask assurance is carried out using the first to N-th (N is an integer not less than 2) mask patterns 12*a* on the photomask 1. In the first embodiment, for each of the first to N-th mask patterns 12*a*, the mask assurance is carried out by comparing secondary moments σx and σy in design data with secondary moments σx and σy in image data. For example, the mask assurance is carried out by comparing secondary moments σx and σy of the K-th mask pattern 12*a* in the design data with secondary moments σx and σy of the K-th mask pattern 12*a* in the image data (K is an integer that satisfies $1 \leq K \leq N$). Similarly, in the second embodiment, for each of the first to N-th mask patterns 12*a*, the mask assurance is carried out by comparing the width W and the height H in design data with the width W and the height H in image data. In the third embodiment, the first to N-th mask patterns 12*a* are sorted into the groups G1 to G8, and comparison between the design data and the image data is carried out on a group basis, instead of a mask pattern 12*a* basis.

In the assurance method according to the third embodiment, mask patterns 12*a* included in design data of the photomask 1 are sorted into groups G1 to G8, and the average and the variation of secondary moments σx and σy of two or more mask patterns 12*a* belonging to each group are calculated. Furthermore, the mask patterns 12*a* included in image data of the photomask 1 are sorted into groups G1 to G8, and the average and the variation of secondary moments σx and σy of two or more mask patterns 12*a* belonging to each group are calculated. Hereinafter, the average and the variation of the former will be referred to as "the average and the variation of secondary moments in design data", and the average and the variation of the latter will be referred to as "the average and the variation of secondary moments in image data". Note that it is possible to calculate the secondary moments σx and σy of each mask pattern 12*a* in the design data and the image data according to the assurance method of the first embodiment.

In the assurance method according to the third embodiment, the mask assurance is then carried out by comparing the average and the variation of secondary moments in design data with the average and the variation of secondary moments in image data. Accordingly, it is possible to assure the shape of the mask pattern 12*a* on the photomask 1 using the average and the variation of secondary moments in place of an ROI. For example, even when the shape of the mask pattern 12*a* is complicated, it is possible to properly assure the shape of the mask pattern 12*a*. Furthermore, the average and the variation of secondary moments of two or more mask patterns 12*a* are used in place of secondary moments of each mask pattern 12*a*, so that it is possible to reduce the number of times of comparison or to ease the criteria for determining whether the mask pattern is acceptable. The average and the variation of secondary moments are examples of values that vary depending on secondary moments.

The assurance method according to the third embodiment is carried out by, for example, the assurance device 201 illustrated in FIG. 8. In this case, the calculation section 223 calculates the average and the variation of secondary moments in design data and the average and the variation of secondary moments in image data, and the comparison section 224 compares the average and the variation of secondary moments in the design data with the average and the variation of secondary moments in the image data. The comparison section 224 calculates the difference between the average of secondary moments σx in the design data and the average of secondary moments σx in the image data as the first difference, and calculates the difference between the average of secondary moments σy in the design data and the average of secondary moments σy in the image data as the second difference. The comparison section 224 further calculates the difference between the variation of the secondary moments σx in the design data and the variation of the secondary moments σx in the image data as the third difference, and calculates the difference between the variation of the secondary moments σy in the design data and the variation of the secondary moments σy in the image data as the fourth difference. The usage of the first to fourth differences according to the third embodiment is similar to the usage of the first and second differences of the first embodiment. Note that, in the third embodiment, only one of the average and the variation may be used instead of using both the average and the variation.

Furthermore, the acquisition section 221 may acquire the average and the variation of secondary moments in design data in place of the design data. In this case, the comparison section 224 uses the average and the variation for comparison. Similarly, the acquisition section 221 may acquire the average and the variation of secondary moments in image data in place of the image data. In this case, the comparison section 224 uses the average and the variation for comparison.

Figure 11:
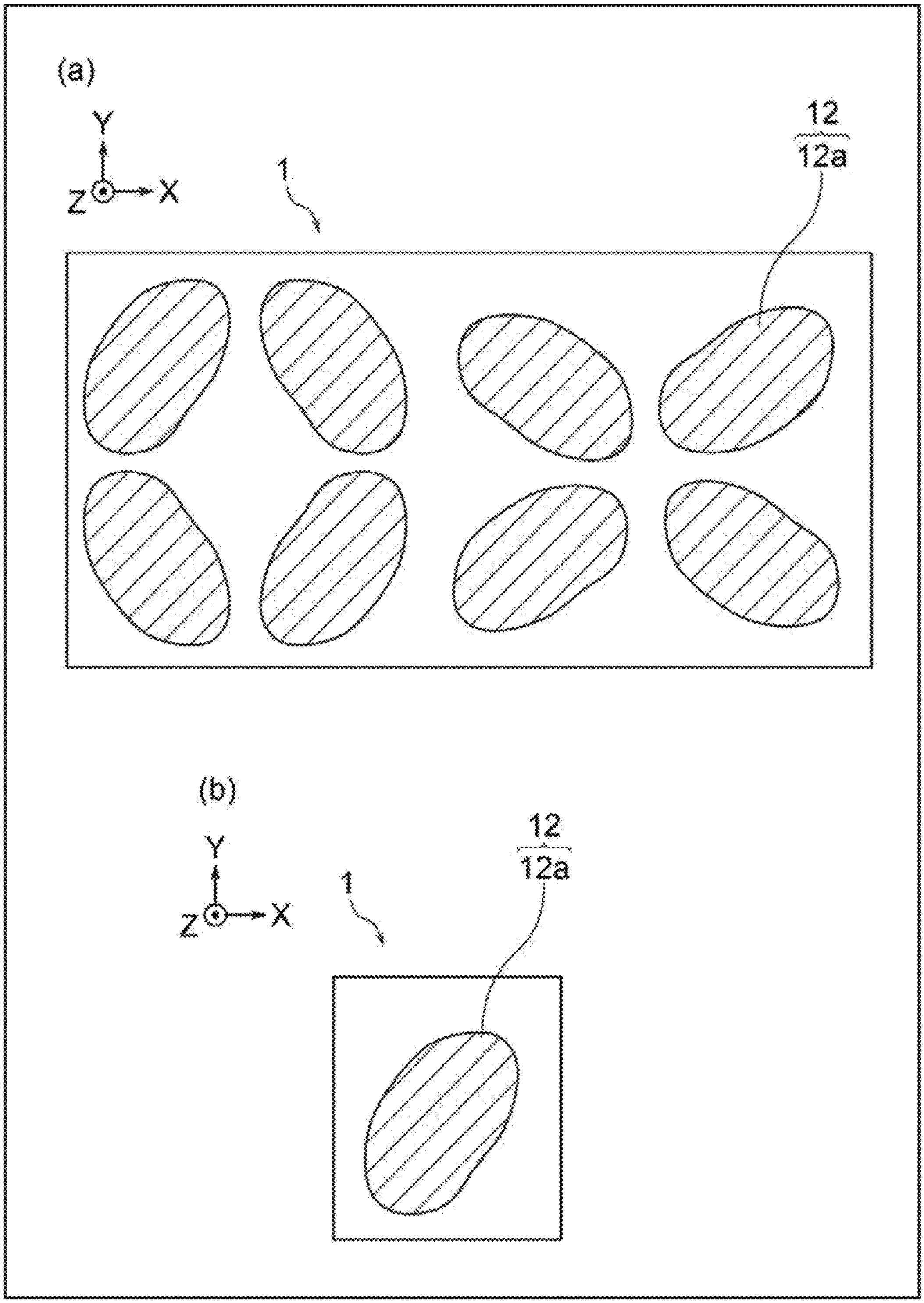
FIG. 11 shows plan views illustrating shapes of mask patterns according to a modification of the third embodiment.

FIG. 11 is a plan view illustrating shapes of mask patterns 12*a* according to a modification of the third embodiment.

The view (a) of FIG. 11 illustrates the shapes of the mask patterns 12*a* extracted from a SEM image. The view (b) of FIG. 11 illustrates one of the mask patterns 12*a*. The mask patterns 12*a* illustrated in the view (a) of FIG. 11 each have a planar shape that overlaps each other by rotation in XY-plane. Note that "rotation" referenced herein may be a combination of rotation and translation. Furthermore, the mask patterns 12*a* illustrated in view (a) of FIG. 11 may each be a planar figure that overlaps each other by symmetric displacement with respect to an axis in XY-plane (for example, X-axis or Y-axis).

When the mask patterns 12*a* on the photomask 1 are to be sorted into one or more groups, two or more mask patterns 12*a* belonging to the same group may each have a planar shape that overlaps each other by translation relative to each other or may each have a planar shape that overlaps each other by rotation relative to each other. In this way, chances are increased for mask patterns 12*a* to be sorted into groups.

As described above, according to the third embodiment, the mask assurance is carried out by comparing the average and the variation of secondary moments in design data with the average and the variation of secondary moments in image data. Accordingly, it is possible to properly assure the shape of the mask pattern 12*a* on the photomask 1 as in the first and second embodiments.

Fourth Embodiment

Figure 12:
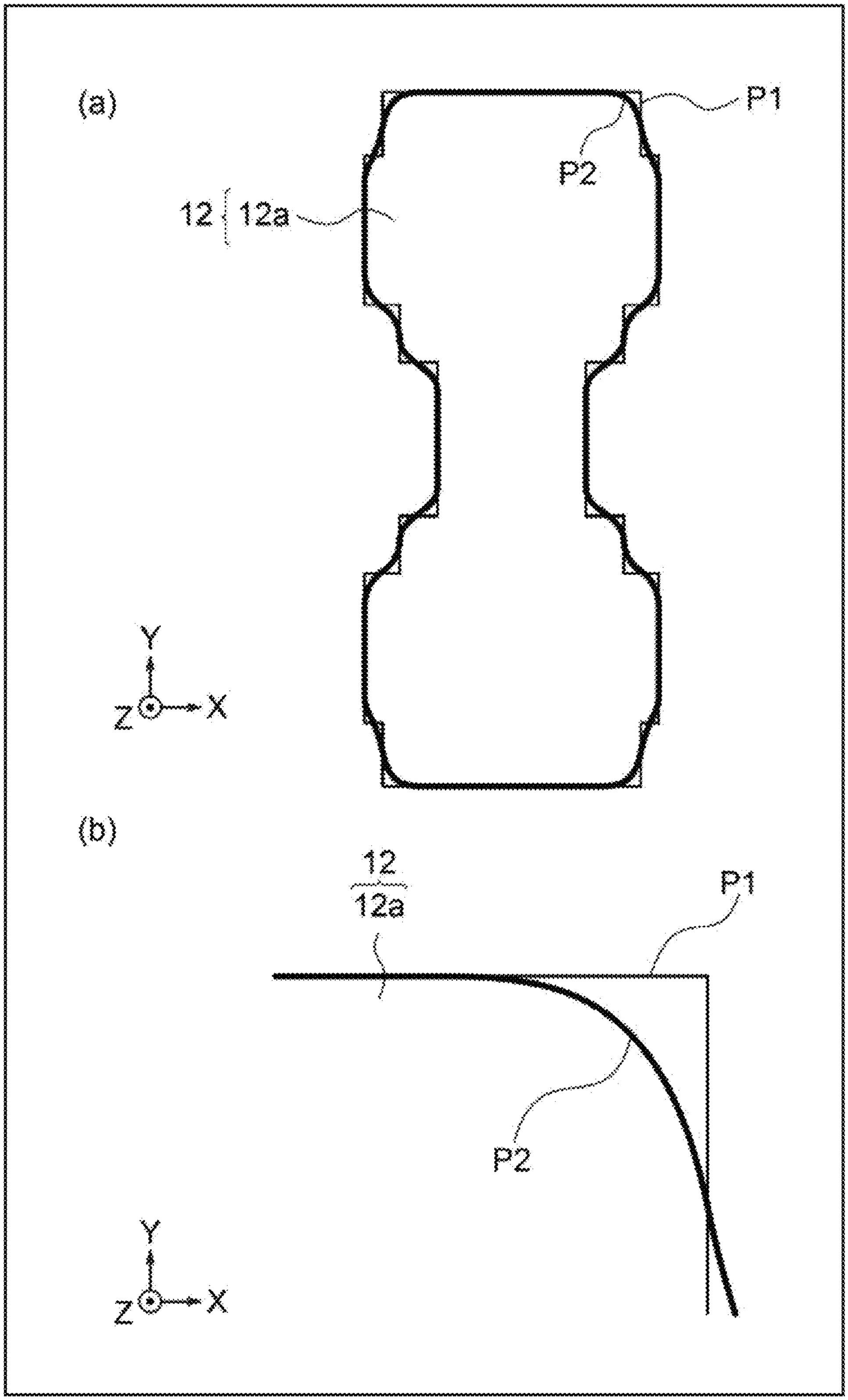
FIG. 12 shows plan views for describing design data and corrected data of a photomask according to a fourth embodiment.

FIG. 12 shows plan views for describing design data and corrected data of the photomask 1 according to a fourth embodiment.

The view (a) of FIG. 12 illustrates an outline P1 of a mask pattern 12*a* included in design data. Specifically, the design data of the photomask 1 includes design data relating to the shape of the mask pattern 12*a*, and the outline P1 indicates the outline of the mask pattern 12*a* indicated in the design data relating to the shape of the mask pattern 12*a*.

The view (a) of FIG. 12 further illustrates an outline P2 of the mask pattern 12*a* included in corrected data obtained by making a correction on the design data. Generally, the outline P1 of the mask pattern 12*a* included in design data does not match the outline of the mask pattern 12*a* that is actually formed in the process in the view (c) of FIG. 1. The reason is that errors occur during electron beam drawing in the view (a) of FIG. 1, development in the view (b) of FIG. 1, etching in the view (c) of FIG. 1, and so on. Accordingly, in the fourth embodiment, the mask assurance is carried out by using corrected data in place of the design data itself. The corrected data is obtained by predicting effects of electron beam drawing, development, etching, and the like on the shape of the mask pattern 12*a* and correcting the design data in consideration of the results of the prediction. In this way, the outline P2 is made closer to the outline of the mask pattern 12*a* that is actually formed than the outline P1.

The view (b) of FIG. 12 illustrates enlarged outlines P1 and P2. Generally, a corner portion of the outline P1 has a linear shape, while a corner portion of the outline P2 has a rounded shape. The reason is that corner portions of the mask pattern 12*a* are generally designed to have linear shapes when the photomask 1 is designed, while it is common that, when the photomask 1 is produced, such corner portions are formed to have rounded shapes due to errors.

The process of producing the photomask 1 will be referred to as "mask process". An example of a mask process model for predicting rounding and the like of corner portions due to the mask process will now be described. The mask process model predicts into what shape the shape of the mask pattern 12*a* included in the design data is turned after being subjected to the mask process. The corrected data of the embodiment is obtained by correcting the design data by the mask process model.

Since the mask process is generally carried out through electron beam drawing, development, etching, and so on, the mask process model is expressed by a convolution integral of the region D and an exponential decay function as indicated by Expression (21).

$$H(x, y) = \int\int_D G(x-u, y-u)dudv \qquad \text{Expression (21)}$$

In the expression, H(x, y) is a mask shape function, and G(x, y) is an exponential decay function. The exponential decay function G(x, y) is given by Expression (22).

$$G(x, y) = \frac{1}{2\pi\sigma^2} e^{-\frac{x^2+y^2}{2\sigma^2}} \qquad \text{Expression (22)}$$

In the expression, σ is a constant that characterizes the mask process. For example, as the resolution of the mask process is higher, the value of σ is lower.

The mask shape function H(x, y) provides a contour line at a certain threshold that gives the shape of the mask pattern 12*a* after the mask process. The double integral of Expression (21) can be replaced with a contour integral as indicated by Expression (23) according to Green's theorem.

$$H(x, y) = -\frac{1}{2\sqrt{2\pi}\,\sigma} \oint_C e^{-\frac{(y-v)^2}{2\sigma^2}} \cdot \mathrm{erf}\left(\frac{x-u}{\sqrt{2}\,\sigma}\right) dv \qquad \text{Expression (23)}$$

The corrected data according to the fourth embodiment may be applied to any of the first to third embodiments. When the corrected data is to be applied to the second embodiment, in the assurance method of the embodiment, a region R' is defined for a mask pattern 12*a* included in the corrected data of the photomask 1, and a width W and a height H of the region R' are calculated. In the assurance method according to the fourth embodiment, a region R' is further defined for the mask pattern 12*a* included in image data of the photomask 1, and a width W and a height H of the region R' are calculated. The mask assurance is then carried out by comparing the width W and the height H in the corrected data with the width W and the height H in image data.

The assurance method according to the fourth embodiment can also be carried out by, for example, the assurance device 201 illustrated in FIG. 8. In this case, the calculation section 223 calculates the width W and the height H in corrected data and the width W and the height H in image data, and the comparison section 224 compares the width W and the height H in corrected data with the width W and the height H in image data. The comparison section 224 calculates the difference between the width W in corrected data and the width W in image data as the first difference, and calculates the difference between the height H in corrected data and the height H in the image data as the second difference. The usage of the first difference and the second difference of the embodiment is similar to the usage of the first difference and the second difference of the first embodiment.

Furthermore, the acquisition section 221 may acquire the width W and the height H in corrected data in place of the corrected data. In this case, the comparison section 224 uses the width W and the height H for comparison. Similarly, the acquisition section 221 may acquire the width W and the height H in image data in place of the image data. In this case, the comparison section 224 uses the width W and the height H for comparison.

According to the fourth embodiment, for example, it is possible to ease the criteria for determining whether the mask pattern is acceptable by using the corrected data in place of the design data itself. The reason is that the mask pattern 12*a* of corrected data is generally closer to a mask pattern 12*a* that is actually formed than the mask pattern 12*a* of design data, so that the difference between the corrected data and the image data is smaller than the difference between the design data and the image data.

As described above, in the fourth embodiment, the mask assurance is carried out by using the corrected data in place of the design data itself. Accordingly, according to the embodiment, it is possible to properly assure the shape of the mask pattern 12*a* on the photomask 1 as in the first to third embodiments.

Fifth Embodiment

Figure 13:
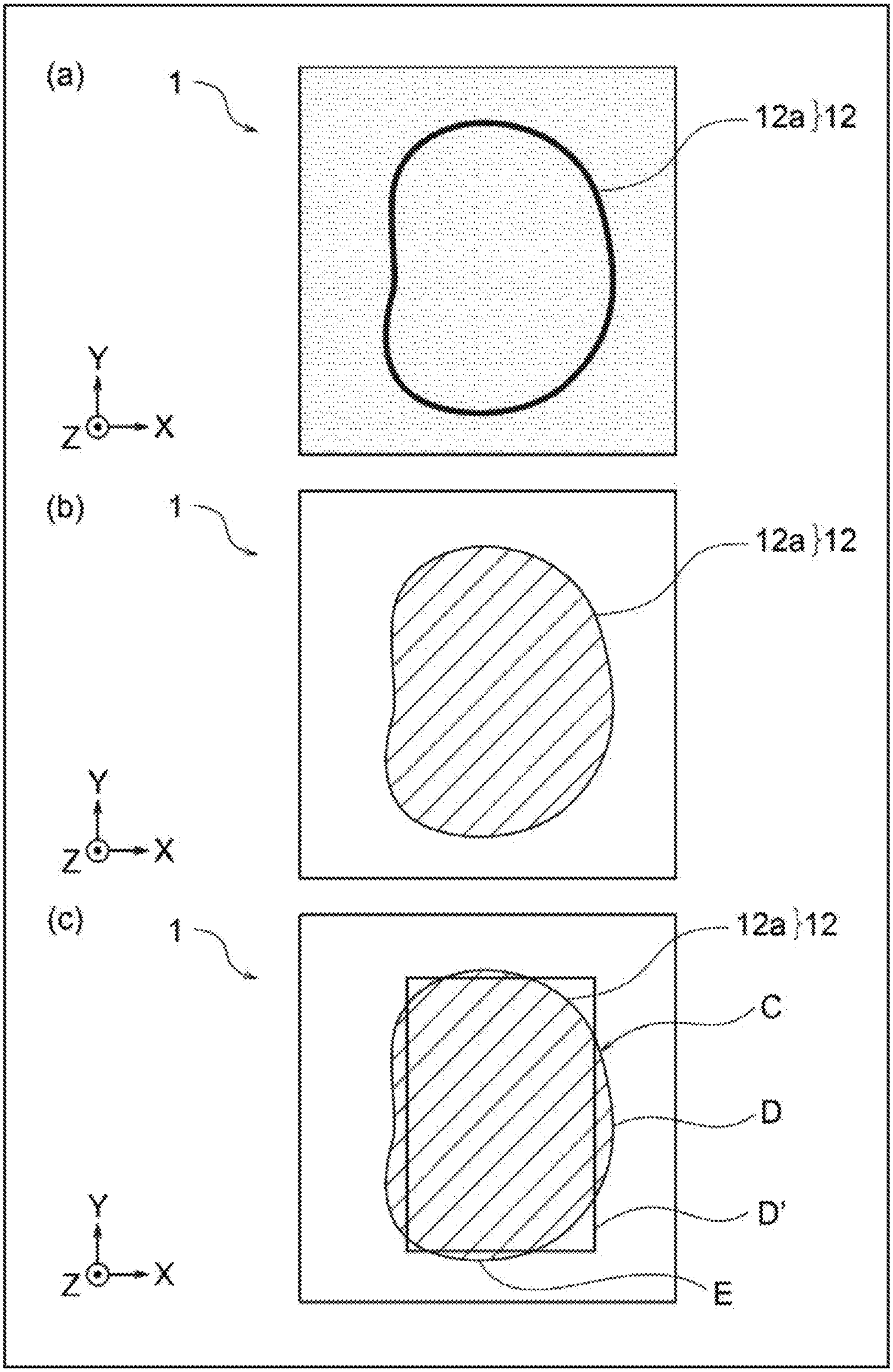
FIG. 13 shows plan views for describing examples of a display method according to a fifth embodiment.

FIG. 13 shows plan views for describing examples of a display method according to a fifth embodiment. The display method of the embodiment takes place, for example, as part of the assurance method of any of the first to fourth embodiments.

The view (a) of FIG. 13 illustrates an SEM image obtained by imaging the photomask 1 of the embodiment by the SEM 101, as in the view (c) of FIG. 4 and the view (a) of FIG. 5. The view (b) of FIG. 13 illustrates a shape of the mask pattern 12*a* extracted from an SEM image, as in the view (b) of FIG. 5.

In the fifth embodiment, the outline E of the mask pattern 12*a* is extracted from image data of the photomask 1. Furthermore, a region D' is defined for the mask pattern 12*a*, and a width W and a height H of the region D' are calculated. As illustrated in the view (c) of FIG. 13, in the display method of the embodiment, the mask pattern 12*a* extracted from image data and the region D' corresponding to the mask pattern 12*a* are overlayed and displayed on a screen of the display device. In this way, an extraction result of the mask pattern 12*a* from image data or a calculation result of the region D' (i.e., the width W and the height H) can be presented to the user. At this time, the mask pattern 12*a* and the region D' are displayed such that the centroid of the mask pattern 12*a* and the centroid of the region D' are overlayed.

Figure 14:
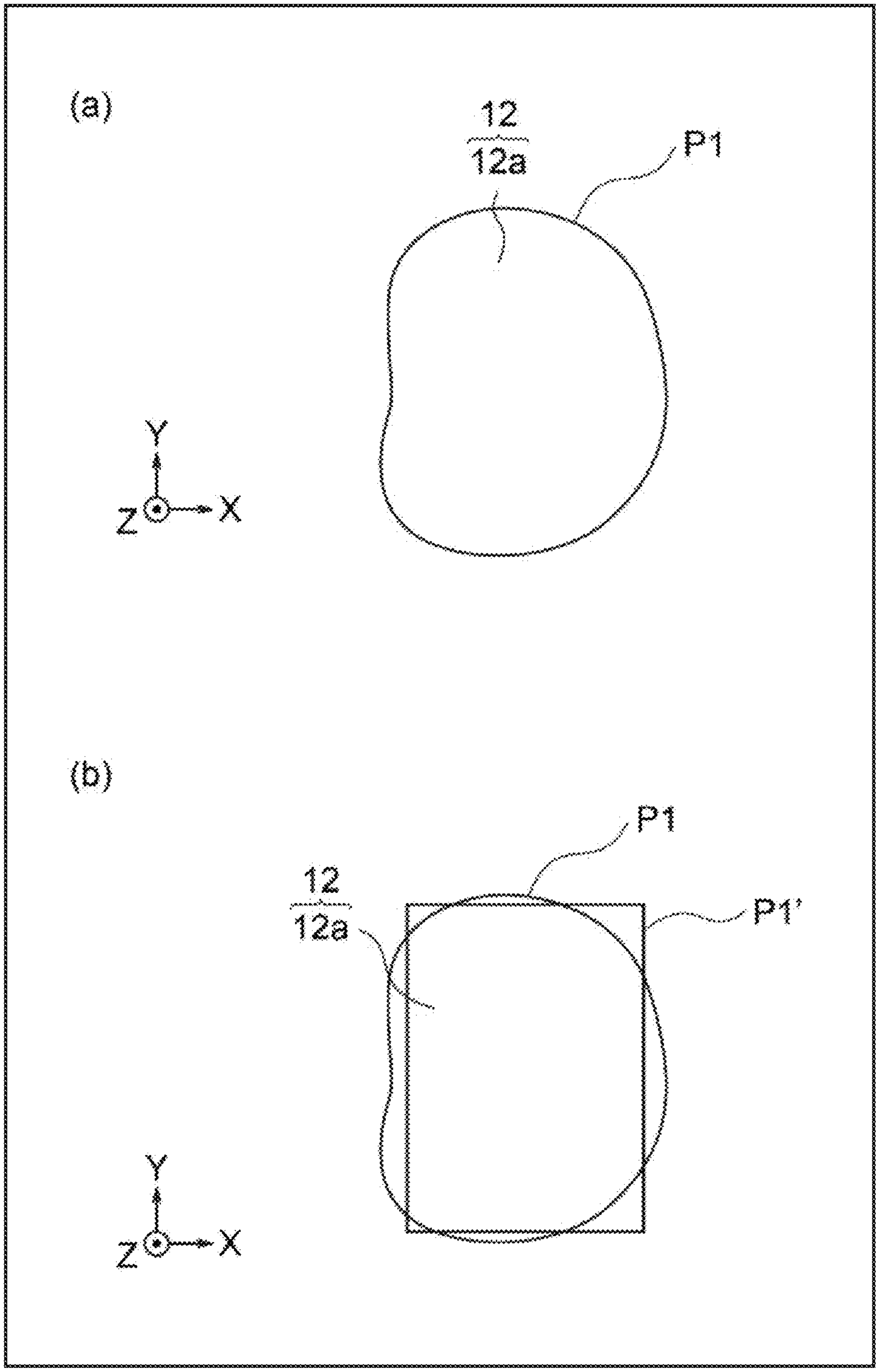
FIG. 14 shows plan views for describing other examples of a display method according to the fifth embodiment.

FIG. 14 shows plan views for describing other examples of a display method according to the fifth embodiment.

The view (a) of FIG. 14 illustrates an outline P1 of the mask pattern 12*a* included in design data of the photomask 1 as in the view (a) of FIG. 12.

In the fifth embodiment, the outline P1 of the mask pattern 12*a* is extracted from design data of the photomask 1. Furthermore, a region P1' is defined for the mask pattern 12*a*, and a width W and a height H of the region P1' are calculated as in the region D' described above. In the display method of the fifth embodiment, as illustrated in the view (b) of FIG. 14, a mask pattern 12*a* extracted from design data and the region P1' corresponding to the mask pattern 12*a* are overlayed and displayed on a screen of the display device. In this way, an extraction result of the mask pattern 12*a* from design data or a calculation result of the region P1' (i.e., the width W and the height H) can be presented to the user. At this time, the mask pattern 12*a* and the region P1' are displayed such that the centroid of the mask pattern 12*a* and the centroid of the region P1' are overlayed. Note that the display method may be carried out using corrected data in place of the design data itself.

The display method according to the fifth embodiment is carried out by, for example, the output section 225 of the assurance device 201 illustrated in FIG. 8. In this case, the display may be performed by the display section 213 of the assurance device 201, or a device external to the assurance device 201. Furthermore, the mask pattern 12*a* and the region D' illustrated in the view (c) of FIG. 13 and the mask pattern 12*a* and the region P1' illustrated in the view (b) of FIG. 14 may be overlayed and displayed on a screen of the display device.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. An inspection device for a photomask for manufacturing a semiconductor substrate, the inspection device comprising:

a memory; and a processor configured to:

acquire design data representing a shape of a designed mask pattern to be formed on a photomask, acquire image data representing a shape of a mask pattern formed on the photomask that was manufactured, based on the design data, determine a first secondary moment of the shape of the designed mask pattern or a first value that varies depending on the first secondary moment, the first secondary moment representing spread of the shape of the designed mask pattern in a first direction and a second direction perpendicular to the first direction, based on the image data, determine a second secondary moment of the shape of the formed mask pattern or a second value that varies depending on the second secondary moment, the second secondary moment representing spread of the shape of the formed mask pattern in the first and second directions, calculate a first difference between the first and second secondary moments or between the first and second values, compare the first difference with a threshold, and determine whether the manufactured photomask is defective based on a result of the comparison, and generate and store, in the memory, result data indicating whether the manufactured photomask is defective.

2. The inspection device according to claim 1, further comprising:

a network interface, wherein the processor is configured to acquire the first secondary moment or the first value and the second secondary moment or the second value from an external device via the network interface.

3. The inspection device according to claim 1, wherein the processor is configured to:

determine a first outline corresponding to the shape of the designed mask pattern using the design data, determine a second outline corresponding to the shape of the formed mask pattern using the image data, calculate the first secondary moment or the first value using the first outline, and calculate the second secondary moment or the second value using the second outline.

4. The inspection device according to claim 3, wherein the processor is configured to approximate the first and second outlines using a polygon.

5. The inspection device according to claim 1, wherein the processor is configured to calculate the first and second secondary moments or the first and second values using Green's theorem.

6. The inspection device according to claim 1, wherein the image data includes an image of the manufactured photomask captured by an external device.

7. The inspection device according to claim 1, wherein the processor is configured to:

determine an area and a centroid of each of the shapes of the designed and formed mask patterns, determine a first width and a first height of a first rectangle that has the same area and centroid as the shape of the designed mask pattern, determine a second width and a second height of a second rectangle that has the same area and centroid as the shape of the formed mask pattern, determine a second difference between the first and second widths and the first and second heights, and determine whether the manufactured photomask is defective based on the second difference.

8. The inspection device according to claim 7, wherein the area of each of the shapes of the designed and formed mask patterns is calculated as a 0-th moment thereof, and the centroid of said each of the shapes is calculated as a primary moment thereof.

9. The inspection device according to claim 1, wherein the processor is configured to:

determine a first average of secondary moments of a first plurality of designed mask patterns using the design data, determine a second average of secondary moments of a second plurality of mask patterns formed on the manufactured photomask using the image data, determine a third difference between the first and second averages, and determine whether the manufactured photomask is defective based on the third difference.

10. The inspection device according to claim 9, wherein the processor is configured to:

determine a first variation of the secondary moments of the first plurality of the designed mask patterns, determine a second variation of the secondary moments of the second plurality of the formed mask patterns, calculate a fourth difference between the first and second variations, and determine whether the manufactured photomask is defective based on the fourth difference.

11. The inspection device according to claim 9, wherein the processor is configured to perform translation, rotation, or axial symmetric displacement on the first plurality of the designed mask patterns and the second plurality of the formed mask patterns to determine whether the mask patterns have the same or substantially the same shape.

12. The inspection device according to claim 9, wherein the processor is configured to:

group a third plurality of designed mask patterns into one or more first groups based on a shape of each of the designed mask patterns, group a fourth plurality of mask patterns formed on the manufactured photomask into one or more second groups based on a shape of each of the formed mask patterns, and the first plurality of the designed mask patterns belong to one of the first groups, and the second plurality of the formed mask patterns belong to one of the second groups.

13. The inspection device according to claim 1, wherein the processor is configured to correct the shape of the designed mask pattern using a mask process model before determining the first secondary moment.

14. The inspection device according to claim 1, further comprising:

a display, wherein the processor is configured to control the display to display information relating to one or both of the design data and the image data.

15. The inspection device according to claim 14, wherein the processor is configured to control the display to display the result data.

16. The inspection device according to claim 14, wherein the processor is configured to control the display to display one or both of:

the designed mask pattern or a rectangle corresponding to the shape of the designed mask pattern, and the formed mask pattern or a rectangle corresponding to the shape of the designed mask pattern.

17. The inspection device according to claim 16, wherein the processor controls the display to display one or both of:

the designed mask pattern and the corresponding rectangle in an overlapping manner, and the formed mask pattern and the corresponding rectangle in an overlapping manner.

18. The inspection device according to claim 1, wherein the processor acquires the image data from a scanning electron microscope.

19. A method of inspecting a photomask for manufacturing a semiconductor substrate, the method comprising:

acquiring design data representing a shape of a designed mask pattern to be formed on a photomask;

acquiring image data representing a shape of a mask pattern formed on the photomask that was manufactured;

based on the design data, determining a first secondary moment of the shape of the designed mask pattern or a first value that varies depending on the first secondary moment, the first secondary moment representing spread of the shape of the designed mask pattern in a first direction and a second direction perpendicular to the first direction;

based on the image data, determining a second secondary moment of the shape of the formed mask pattern or a second value that varies depending on the second secondary moment, the second secondary moment representing spread of the shape of the formed mask pattern in the first and second directions;

calculating a first difference between the first and second secondary moments or between the first and second values;

comparing the first difference with a threshold, and determining whether the manufactured photomask is defective based on a result of the comparison; and generating and storing, in a memory, result data indicating whether the manufactured photomask is defective.

20. A non-transitory computer readable medium storing a program causing a computer to execute a method of inspecting a photomask for manufacturing a semiconductor substrate, the method comprising:

acquiring design data representing a shape of a designed mask pattern to be formed on a photomask;

acquiring image data representing a shape of a mask pattern formed on the photomask that was manufactured;

based on the design data, determining a first secondary moment of the shape of the designed mask pattern or a first value that varies depending on the first secondary moment, the first secondary moment representing spread of the shape of the designed mask pattern in a first direction and a second direction perpendicular to the first direction;

based on the image data, determining a second secondary moment of the shape of the formed mask pattern or a second value that varies depending on the second secondary moment, the second secondary moment representing spread of the shape of the formed mask pattern in the first and second directions;

calculating a first difference between the first and second secondary moments or between the first and second values;

comparing the first difference with a threshold, and determining whether the manufactured photomask is defective based on a result of the comparison; and generating and storing, in a memory, result data indicating whether the manufactured photomask is defective.

* * * * *